(12) United States Patent
Luechinger et al.

(10) Patent No.: US 8,196,798 B2
(45) Date of Patent: Jun. 12, 2012

(54) SOLAR SUBSTRATE RIBBON BONDING SYSTEM

(75) Inventors: Christoph Benno Luechinger, Irvine, CA (US); Orlando Luis Valentin, Rancho Santa Margarita, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 13/269,796

(22) Filed: Oct. 10, 2011

(65) Prior Publication Data

US 2012/0085812 A1 Apr. 12, 2012

Related U.S. Application Data

(60) Provisional application No. 61/391,273, filed on Oct. 8, 2010, provisional application No. 61/411,525, filed on Nov. 9, 2010.

(51) Int. Cl.
*B23K 1/06* (2006.01)
*B23K 37/04* (2006.01)

(52) U.S. Cl. .......... 228/1.1; 228/4.5; 228/6.2; 228/49.1; 228/49.2; 228/49.5

(58) Field of Classification Search .................. None
See application file for complete search history.

(56) References Cited

U.S. PATENT DOCUMENTS

| | | | |
|---|---|---|---|
| 4,591,087 A | 5/1986 | Frasch | |
| 4,617,722 A | 10/1986 | Willis | |
| 5,151,377 A | 9/1992 | Hanoka et al. | |
| 5,799,858 A * | 9/1998 | Nam et al. | 228/6.2 |
| 5,894,983 A | 4/1999 | Beck et al. | |
| 5,979,739 A * | 11/1999 | Jin et al. | 228/6.2 |
| 6,182,882 B1 * | 2/2001 | Hortaleza et al. | 228/4.5 |
| 6,196,445 B1 * | 3/2001 | Fogal et al. | 228/180.5 |
| 6,269,999 B1 | 8/2001 | Okazaki et al. | |
| 6,322,659 B1 * | 11/2001 | Tekavec et al. | 156/312 |
| 6,439,447 B1 * | 8/2002 | Minamitani et al. | 228/104 |
| 6,441,297 B1 * | 8/2002 | Keller et al. | 136/249 |
| 6,705,511 B1 * | 3/2004 | Dames et al. | 228/180.5 |
| 7,549,567 B2 * | 6/2009 | Higashi et al. | 228/110.1 |
| 7,568,606 B2 * | 8/2009 | Wong et al. | 228/43 |
| 7,595,582 B2 | 9/2009 | Ozaki et al. | |
| 7,637,411 B2 * | 12/2009 | Sadler | 228/4.5 |
| 7,677,431 B2 * | 3/2010 | Wong et al. | 228/179.1 |

(Continued)

FOREIGN PATENT DOCUMENTS

DE 102009044060 A1 3/2011

(Continued)

*Primary Examiner* — Kiley Stoner
(74) *Attorney, Agent, or Firm* — Christopher M. Spletzer, Sr.

(57) ABSTRACT

An ultrasonic solar substrate bonding system is provided. The system includes a first ribbon bonder including a first bonding tool, and a first ribbon feeding system configured to continuously supply a first ribbon material to the first bonding tool during bonding of the first ribbon material to a backside of each of a plurality of solar substrates. The system also includes a mechanism configured to manipulate each of the plurality of solar substrates after bonding by the first ribbon bonder to expose an opposite, frontside of each of the plurality of solar substrates for bonding. The system also includes a second ribbon bonder including a second bonding tool, and a second ribbon feeding system configured to continuously supply a second ribbon material to the second bonding tool during bonding of the second ribbon material to the frontside of each of the plurality of solar substrates.

22 Claims, 27 Drawing Sheets

U.S. PATENT DOCUMENTS

| | | | |
|---|---|---|---|
| 7,745,253 B2 | 6/2010 | Luechinger | |
| 7,828,031 B2 | 11/2010 | Micciche | |
| 2003/0098340 A1* | 5/2003 | Wong et al. | 228/180.5 |
| 2003/0160084 A1 | 8/2003 | Higashiyama | |
| 2004/0129754 A1* | 7/2004 | Suresh et al. | 228/4.5 |
| 2004/0219801 A1 | 11/2004 | Oswald et al. | |
| 2006/0060631 A1* | 3/2006 | Frasch et al. | 228/4.5 |
| 2006/0266792 A1* | 11/2006 | Ko et al. | 228/6.2 |
| 2006/0278682 A1 | 12/2006 | Lange et al. | |
| 2007/0079862 A1* | 4/2007 | Kawagoe et al. | 136/244 |
| 2008/0023525 A1* | 1/2008 | Maeda et al. | 228/18 |
| 2009/0236328 A1 | 9/2009 | Dingle et al. | |
| 2009/0256581 A1* | 10/2009 | Lu et al. | 324/715 |
| 2010/0037932 A1 | 2/2010 | Erez et al. | |
| 2010/0058582 A1 | 3/2010 | Hofmann et al. | |
| 2010/0116310 A1* | 5/2010 | Shimizu et al. | 136/244 |
| 2010/0140326 A1* | 6/2010 | Ebihara et al. | 228/111.5 |
| 2010/0181011 A1* | 7/2010 | Hashimoto et al. | 156/166 |
| 2010/0240166 A1* | 9/2010 | Ishii et al. | 438/61 |
| 2010/0282288 A1 | 11/2010 | Cornfeld | |
| 2012/0012645 A1* | 1/2012 | Motomura et al. | 228/179.1 |
| 2012/0077302 A1* | 3/2012 | Abe et al. | 438/80 |

FOREIGN PATENT DOCUMENTS

| | | | |
|---|---|---|---|
| JP | 58-200552 A * | 11/1983 | |
| JP | 60060775 | 4/1985 | |
| JP | 01-061027 A * | 3/1989 | |
| JP | 02-028339 A * | 1/1990 | |
| JP | 05-136195 A * | 6/1993 | |
| JP | 10-163276 | 6/1998 | |
| JP | 10-321654 | 12/1998 | |
| JP | 2000-232187 | 8/2000 | |
| WO | WO2003/012883 A2 | 2/2003 | |
| WO | WO2009/097588 A2 | 8/2009 | |
| WO | WO2009/149211 A2 | 12/2009 | |
| WO | WO2010/091680 A2 | 8/2010 | |
| WO | WO2010/128021 A2 | 11/2010 | |
| WO | WO2011/123539 A2 | 10/2011 | |
| WO | WO2011/137269 A2 | 11/2011 | |
| WO | WO2012/012335 A2 | 1/2012 | |

* cited by examiner

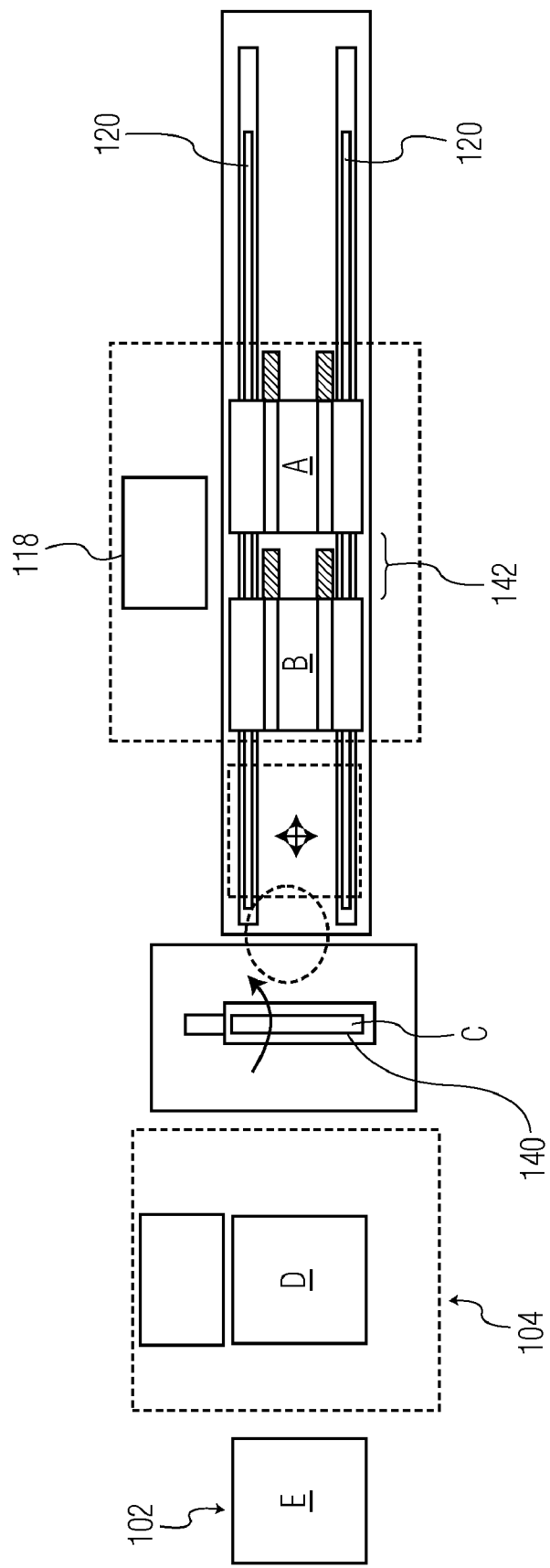

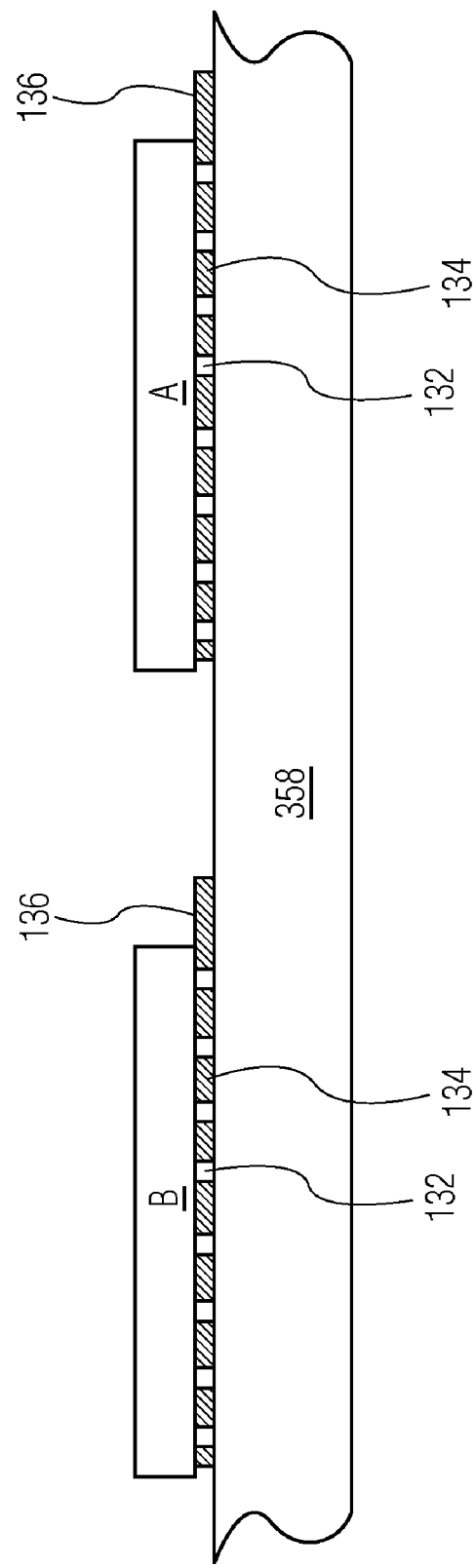

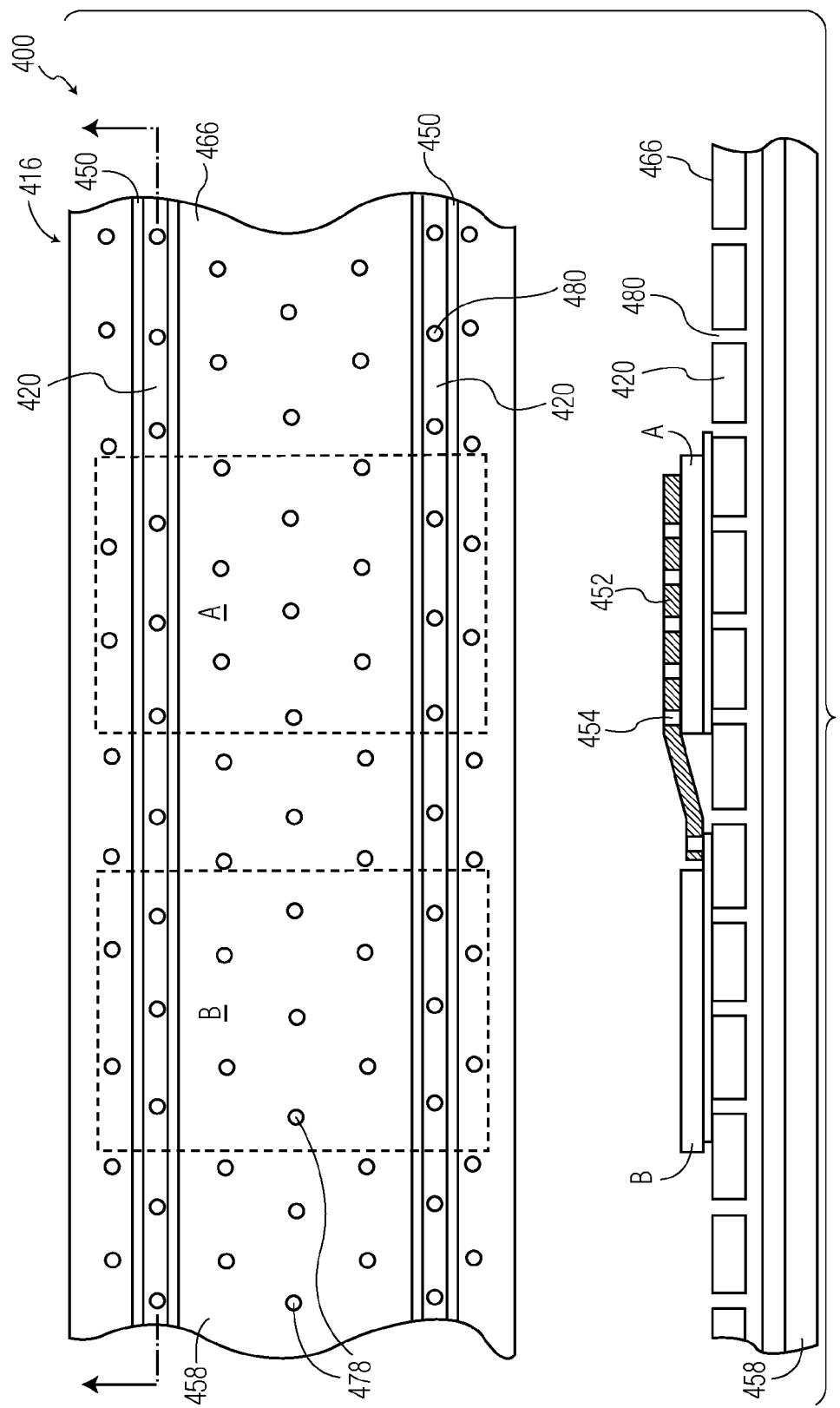

US 8,196,798 B2

SOLAR SUBSTRATE RIBBON BONDING SYSTEM

CROSS-REFERENCE TO RELATED APPLICATION

This application claims the benefit of U.S. Provisional Application No. 61/391,273, filed Oct. 8, 2010, and of U.S. Provisional Application No. 61/411,525, filed Nov. 9, 2010, the contents of both of which are incorporated herein by reference.

FIELD OF THE INVENTION

The present invention relates to ultrasonic bonding operations, and more particularly, to ribbon bonding systems for solar cells and the like.

BACKGROUND OF THE INVENTION

In the processing and packaging of semiconductor devices, ultrasonic bonding (e.g., wire bonding, ribbon bonding, etc.) continues to be a widely used method of providing electrical interconnection between two locations within a package (e.g., between a bond pad of a semiconductor die and a lead of a leadframe). For example, ribbon bonding machines are used to form ribbon interconnections between respective locations to be electrically interconnected. The upper terminal end of a bonding tool is, in many instances, configured to be engaged in a transducer (e.g., an ultrasonic transducer) of a ribbon bonding system which causes the bonding tool to vibrate upon bonding. Ultrasonic bonding is a joining process that, for example, may use relative motion between the ribbon and the surface it is bonded to. It is this relative motion that enables the bond formation.

In providing interconnection in solar cell applications (e.g., crystalline silicon solar cells, thin film solar cells, etc.), techniques such as soldering or conductive adhesive bonding have been used to electrically connect adjacent cells, so as to collect electricity from multiple cells, etc.

SUMMARY OF THE INVENTION

According to an exemplary embodiment of the present invention, an ultrasonic solar substrate bonding system is provided. The system includes a first ribbon bonder including a first bonding tool, and a first ribbon feeding system configured to continuously supply a first ribbon material to the first bonding tool during bonding of the first ribbon material to a first side of each of a plurality of solar substrates. The system also includes a mechanism, configured to manipulate each of the plurality of solar substrates after bonding by the first ribbon bonder, to expose an opposite, second side of each of the plurality of solar substrates for bonding. The system also includes a second ribbon bonder including a second bonding tool, and a second ribbon feeding system configured to continuously supply a second ribbon material to the second bonding tool during bonding of the second ribbon material to the second side of each of the plurality of solar substrates. Each of the first side and the second side may be: (1) the backside of the solar substrates; or (2) the frontside of the solar substrates (including active solar material for absorbing solar energy).

According to another exemplary embodiment of the present invention, a method of providing electrical interconnection between solar substrates is provided. The method comprises the steps of: (a) ultrasonically bonding a first ribbon material to a first side of ones of a plurality of solar substrates using a first bonding tool of a first ribbon bonder, the first ribbon material being fed from a first ribbon supply to a position proximate the first bonding tool using a first ribbon feeding system; (b) manipulating ones of the plurality of solar substrates after step (a) to expose an opposite, second side of the plurality of solar substrates; and (c) ultrasonically bonding a second ribbon material to the second side of ones of the plurality of solar substrates using a second bonding tool of a second ribbon bonder, the second ribbon material being fed from a second ribbon supply to a position proximate the second bonding tool using a second ribbon feeding system.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 2A-2K are a series of a plan, overhead block diagram views of the ultrasonic solar substrate bonding system of FIG. 1, illustrating a sequential ribbon bonding operation in accordance with an exemplary embodiment of the present invention;

FIG. 3A is a cross-sectional block diagram of adjacent backside bonded solar substrates in accordance with another exemplary embodiment of the present invention;

FIG. 4 is an overhead block diagram view, and a corresponding cross-sectional side block diagram view, of two solar substrates supported by a workholder during a bonding operation in accordance with another exemplary embodiment of the present invention.

DETAILED DESCRIPTION OF THE INVENTION

Figure 1A:
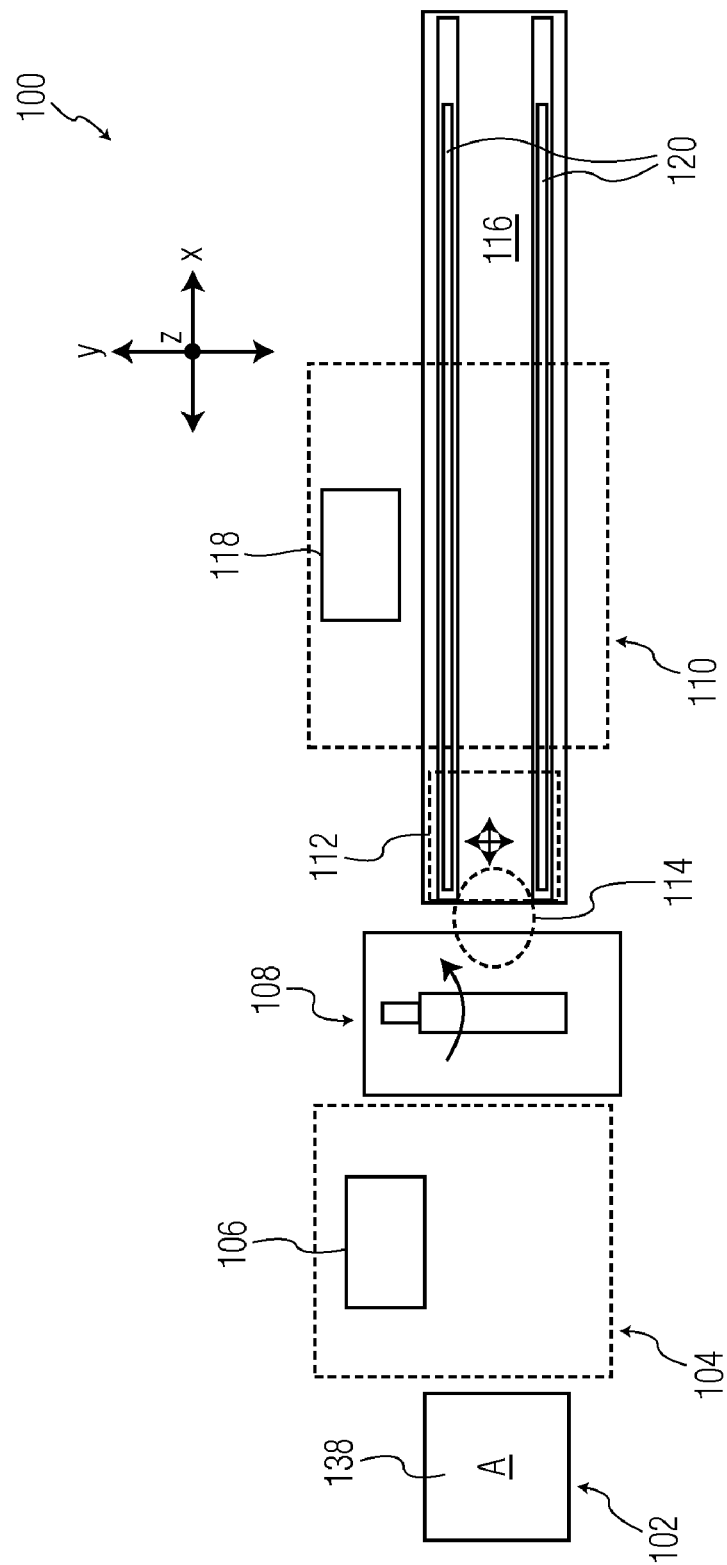
FIG. 1A is a plan, overhead block diagram view of an ultrasonic solar substrate bonding system in accordance with an exemplary embodiment of the present invention.

FIG. 1A is an overhead view of ultrasonic ribbon bonding system 100 (i.e., ultrasonic solar substrate bonding system 100) for bonding a first length of conductive ribbon material to a backside of a solar substrate, and bonding a second length of conductive material to a frontside of an adjacent solar substrate, and for joining the first length to the second length at a location between the adjacent solar substrates (e.g., crystalline solar cells, thin film solar cells, etc.). In certain examples, the solar substrate's frontside includes an exposed active solar material configured for receiving light energy and converting the light energy into electrical energy, and the solar substrate's backside is at least partially defined by an electrically conductive region. System 100 includes input stack 102 of solar substrates with a first solar substrate "A"

shown on the top of input stack 102 with its backside 138 exposed. To the right of input stack 102 is backside ribbon bonder 104 including corresponding XY table 106. As will be explained in greater detail with respect to FIG. 1B below, backside ribbon bonder 106 includes a backside workholder which may desirably be integrated into part of a backside indexing system (also known as a material handling system) for supporting (and moving) ones of a plurality of solar substrates in connection with the ribbon bonding operation. Backside XY table 106 carries a backside bond head assembly that in turn includes an ultrasonic transducer, a ribbon bonding tool, a cutter, etc. (not shown in FIG. 1A but see exemplary BHA shown in FIG. 5A). In conjunction with a backside ribbon feeding system, backside ribbon bonder 104 is used to bond continuous lengths of a first ribbon material across respective backsides 138 of ones of a plurality of solar substrates. For example, each of the lengths of the first ribbon material may be bonded such that a segment (e.g., a tab segment) of the first ribbon material (continuous with the ultrasonically bonded first ribbon material) extends past an edge of a backside of a respective solar substrate (e.g., see FIG. 2B). After bonding by backside ribbon bonder 104, mechanism 108 (e.g., flipper 108 in FIG. 1A) is provided to manipulate (e.g., flip or otherwise manipulate) each of the plurality of solar substrates to expose an opposite side (e.g., the frontside) of each of the plurality of solar substrates for further bonding by a second (frontside) ribbon bonder 110.

To the right of mechanism 108 is frontside alignment unit 112 (e.g., centering unit 112) which may include optical device 114 such as a camera (e.g., a look-up camera, a downward looking camera, etc.). Frontside alignment unit 112 (and frontside indexing system 116) may also include material handling components known to those skilled in the art such as gripping mechanisms, pushing mechanisms, pulling mechanisms, lifting mechanisms, flipping mechanisms, etc. (not shown) as is desired in the given application. System 100 also includes frontside indexing system 116 (also known as a material handling system) for supporting (and moving) ones of a plurality of solar substrates with their frontsides exposed. In the illustrated example, frontside indexing system 116 includes walking beam elements 120 (where elements 120 are part of a walking beam system the operation of which will be described below); however, other types of indexing systems are contemplated. In conjunction with a frontside ribbon feeding system, frontside ribbon bonder 110 is provided along the length of frontside indexing system 116 and includes frontside XY table 118 that carries a frontside bond head assembly (not shown). Exemplary elements of the frontside bond head assembly include an ultrasonic transducer, a ribbon bonding tool, a cutter, etc. (not shown, but that may be similar to bond head assembly BHA shown in FIG. 5A). Frontside ribbon bonder 110 is configured to bond continuous lengths of a second ribbon material (which may or may not be the same as the first ribbon material) between respective frontsides of each of the plurality of solar substrates, and a corresponding one of tab segments/tabs (first ribbon material segment) of the first ribbon material (previously bonded with backside ribbon bonder 104) on an adjacent solar substrate.

Figure 1B:
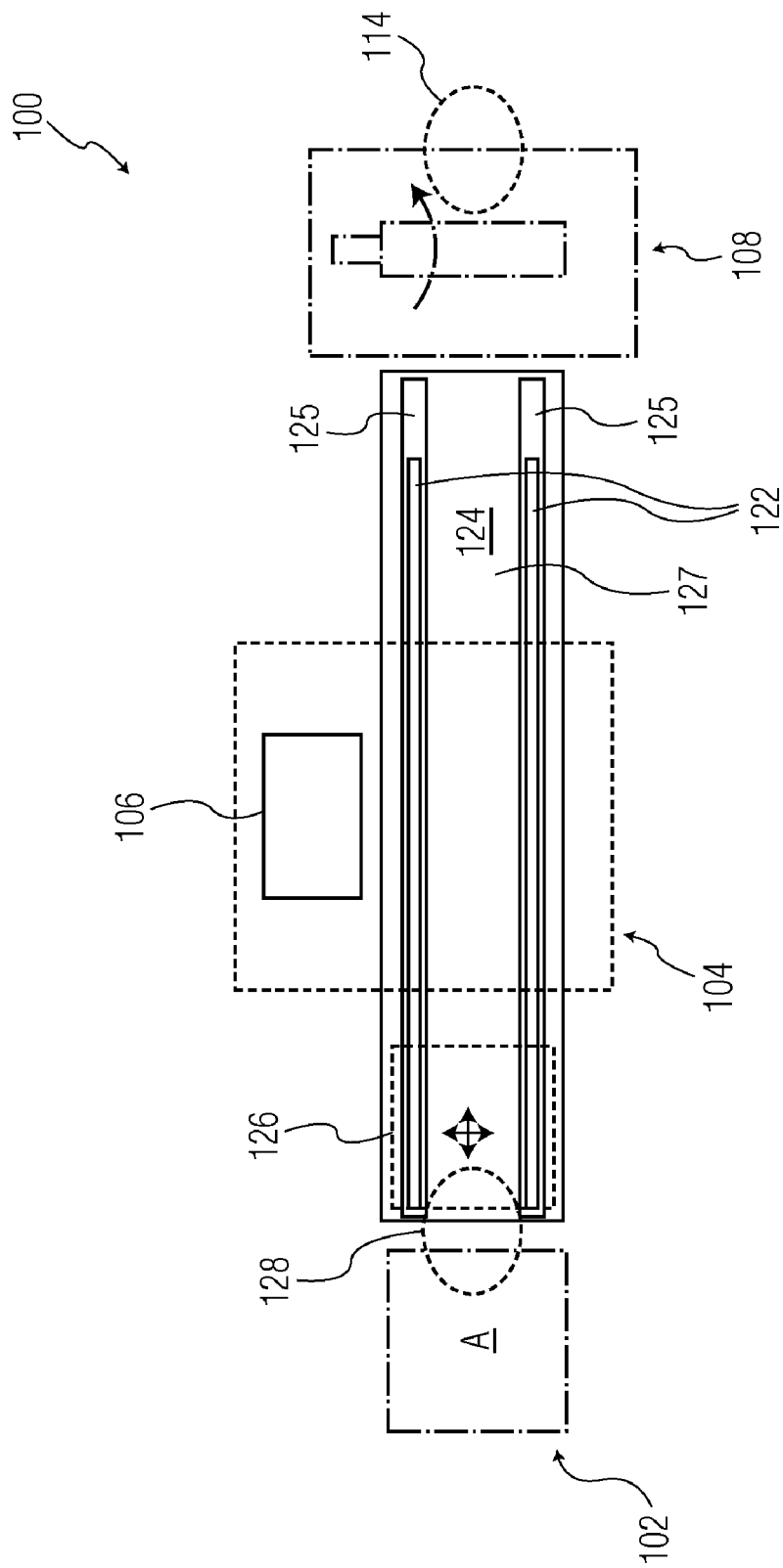
FIG. 1B is a plan, overhead block diagram view of details of a portion of the ultrasonic solar substrate bonding system of FIG. 1A in accordance with an exemplary embodiment of the present invention.

FIG. 1B is an overhead view of a portion of ultrasonic ribbon bonding system 100 of FIG. 1A, with particular emphasis on backside ribbon bonder 104. It is noted that the components of backside ribbon bonder 104 (and corresponding backside indexing system 124) may be similar to those of frontside ribbon bonder 110 unless otherwise shown or noted. In FIG. 1B, input stack 102, mechanism 108, and frontside optical device/camera 114 are shown in dashed lines. To the right of backside input stack 102 is backside alignment unit 126 (e.g., a centering unit) which may work in conjunction with backside optical device 128 such as a camera (e.g., a look-up camera, a downward looking camera, etc.) for aligning the substrates received from input stack 102. Backside alignment unit 126 may include a pusher (or other mechanism—not shown) for aligning each of the plurality of solar substrates to a reference position. Backside alignment unit 126 (and backside indexing system 124) may include material handling components known to those skilled in the art such as gripping mechanisms, pushing mechanisms, pulling mechanisms, lifting mechanisms, flipping mechanisms, etc. (not shown) as is desired in the given application. It is noted that the alignment of the substrates by backside alignment unit 126 may take into account structures on the face down frontside of the substrates during bonding on the backside. For example, busbars and/or current fingers on the substrate frontside may be aligned in such a way as to minimize damage to the solar substrate. In a specific example, the busbars may be aligned to contact a support structure of backside ribbon bonder 104 during bonding, such that the ribbon is bonded to an area of the backside of the solar substrate generally opposite the busbar and in that area supported by the workholder.

Backside alignment unit 126 and backside ribbon bonder 104 are shown with reference to backside indexing system 124 (also known as material handling system 124) for supporting (and moving) ones of a plurality of solar substrates. In the illustrated example, backside indexing system 124 includes apertures 125 within which backside walking beam elements 122 fit (where elements 122 are part of a walking beam system the operation of which will be described below); however, other types of indexing systems are contemplated. Backside ribbon bonder 104 is provided along the length of backside indexing system 124 and includes backside XY table 106 that carries a backside bond head assembly. The backside bond head assembly (not shown in FIG. 1B, but that may be similar to bond head assembly BHA shown in FIG. 5A) includes elements as desired in the given application such as, for example, a transducer, a ribbon bonding tool, a cutter, etc. The operation of the exemplary system shown in FIGS. 1A-1B will be described in connection with FIGS. 2A-2K.

While frontside and backside alignment systems 112, 126 in FIGS. 1A-1B (as well as other alignment systems described herein) have been described in connection with frontside and backside optical systems 114, 128 such as cameras, other systems are contemplated such as mechanical alignment structures (e.g., pushing a substrate to contact an alignment structure, etc.) amongst others.

Figure 2A:
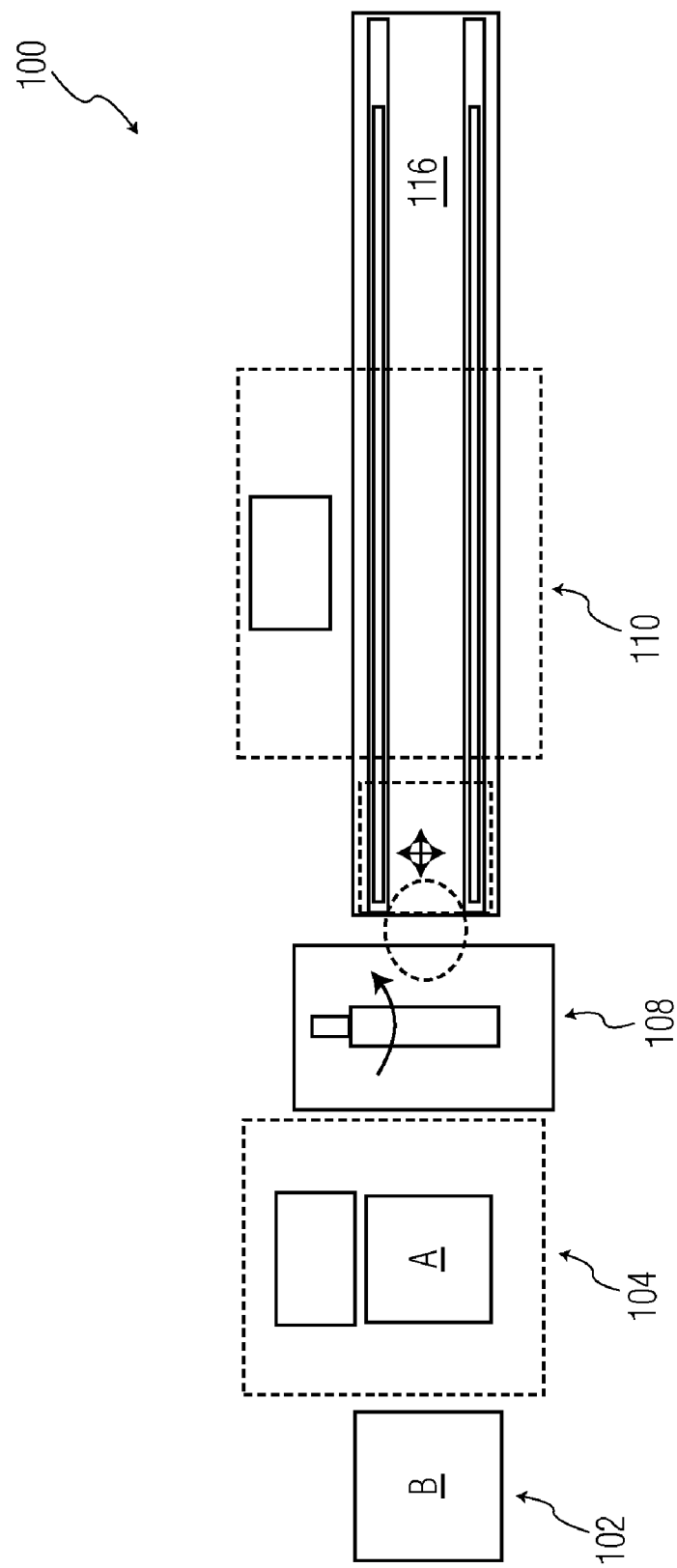

FIGS. 2A-2K illustrate an exemplary sequential ribbon bonding operation of ultrasonic solar substrate bonding system 100 of FIG. 1. Specifically, FIG. 2A illustrates solar substrate "A" that has been moved from input stack 102 to backside indexing system 124 (not shown in FIG. 2A, but see, e.g., FIG. 1B) of backside ribbon bonder 104 (e.g., using backside alignment 126 unit not shown in FIG. 2A but see, e.g., FIG. 1B), with the next solar substrate "B" on the top of input stack 102. Thus, backside material handling system 124 is between input stack 102 and mechanism 108 configured to manipulate (e.g., flip) each of the plurality of solar substrates, and is configured to: (a) position each of the plurality of solar substrates upstream of first ribbon bonder 110; and (b) support the plurality of solar substrates during bonding with the first ribbon material. In this example, it is desired to electrically interconnect substrates "A"-"D" in a string as will be shown and described. In FIG. 2A, solar substrate "A" is in a position to be bonded by backside ribbon bonder 104.

Figure 2B:
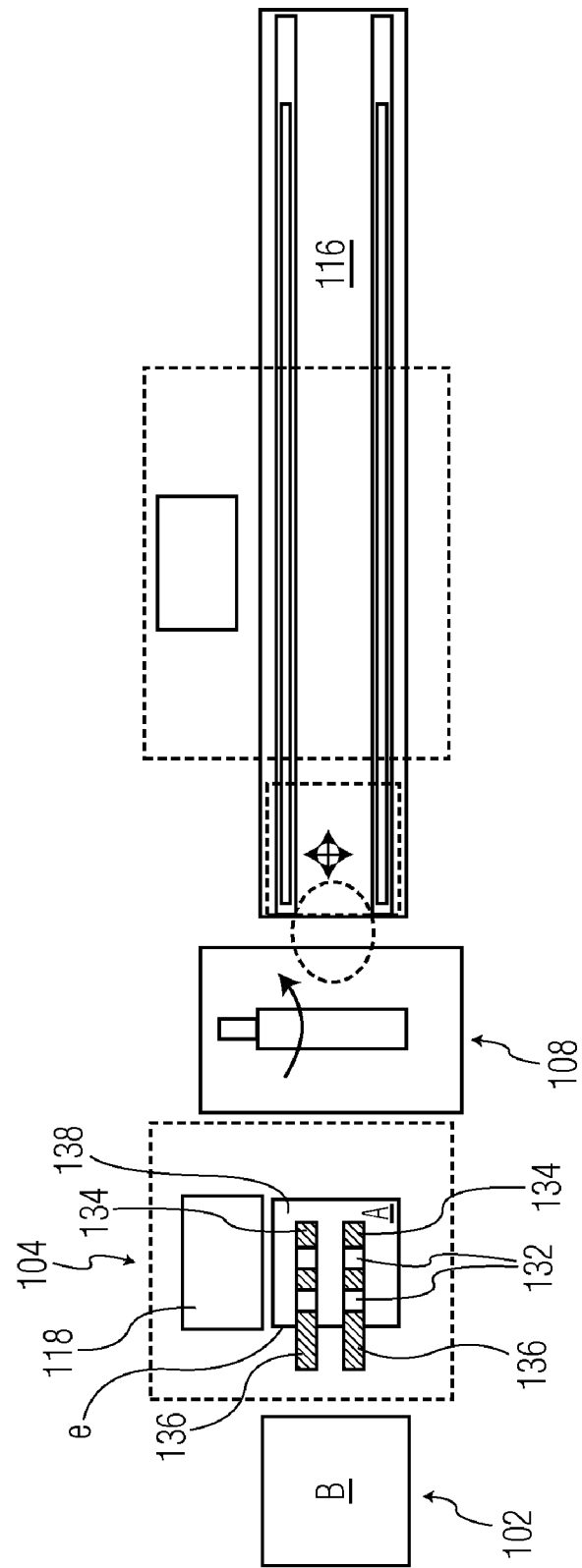
Figure 5A:
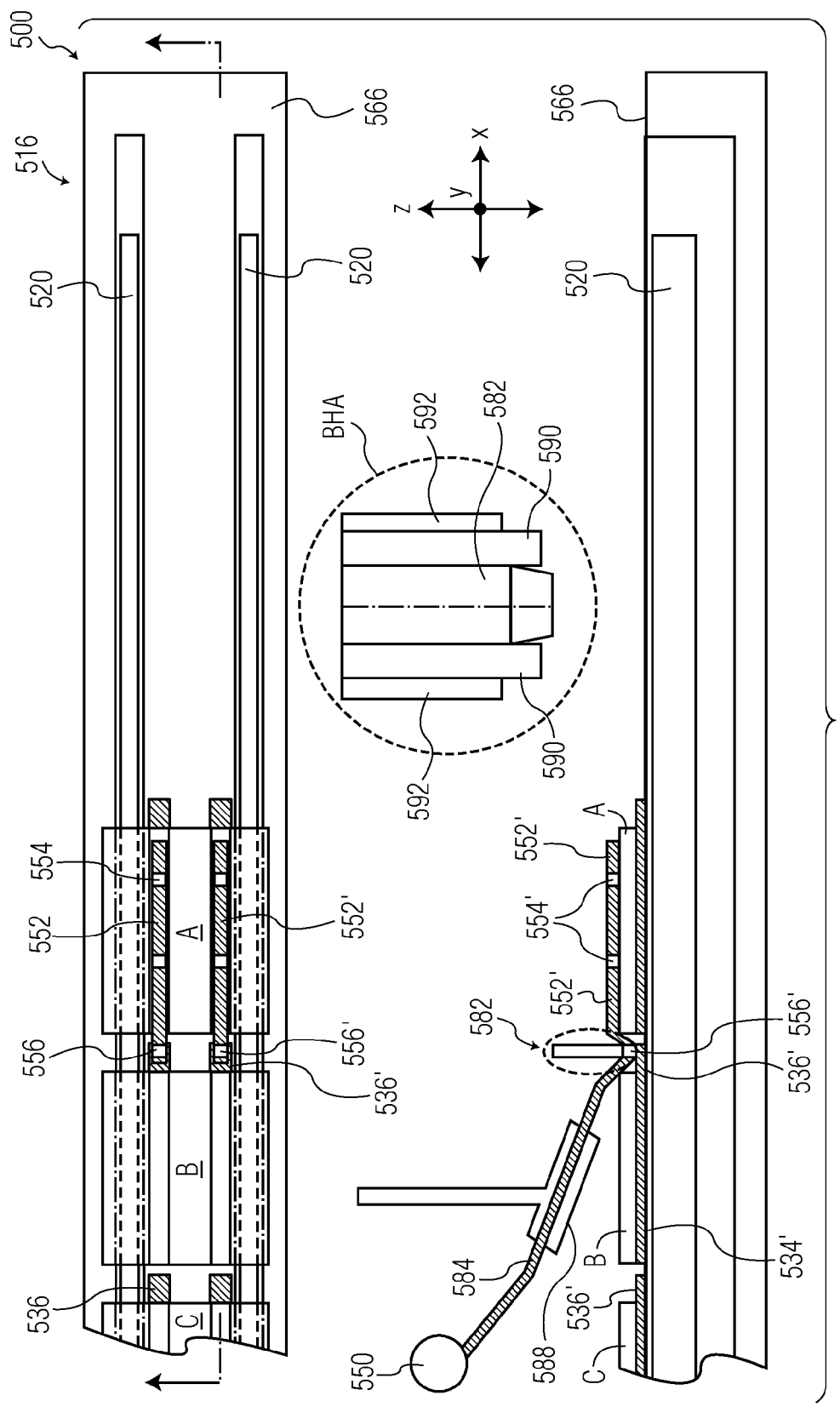
FIGS. 5A-5F are a series of overhead block diagram views, and corresponding modified cross-sectional side block diagram views, of a ultrasonic solar substrate bonding system illustrating a material handling system in accordance with another exemplary embodiment of the present invention.
Figure 5B:
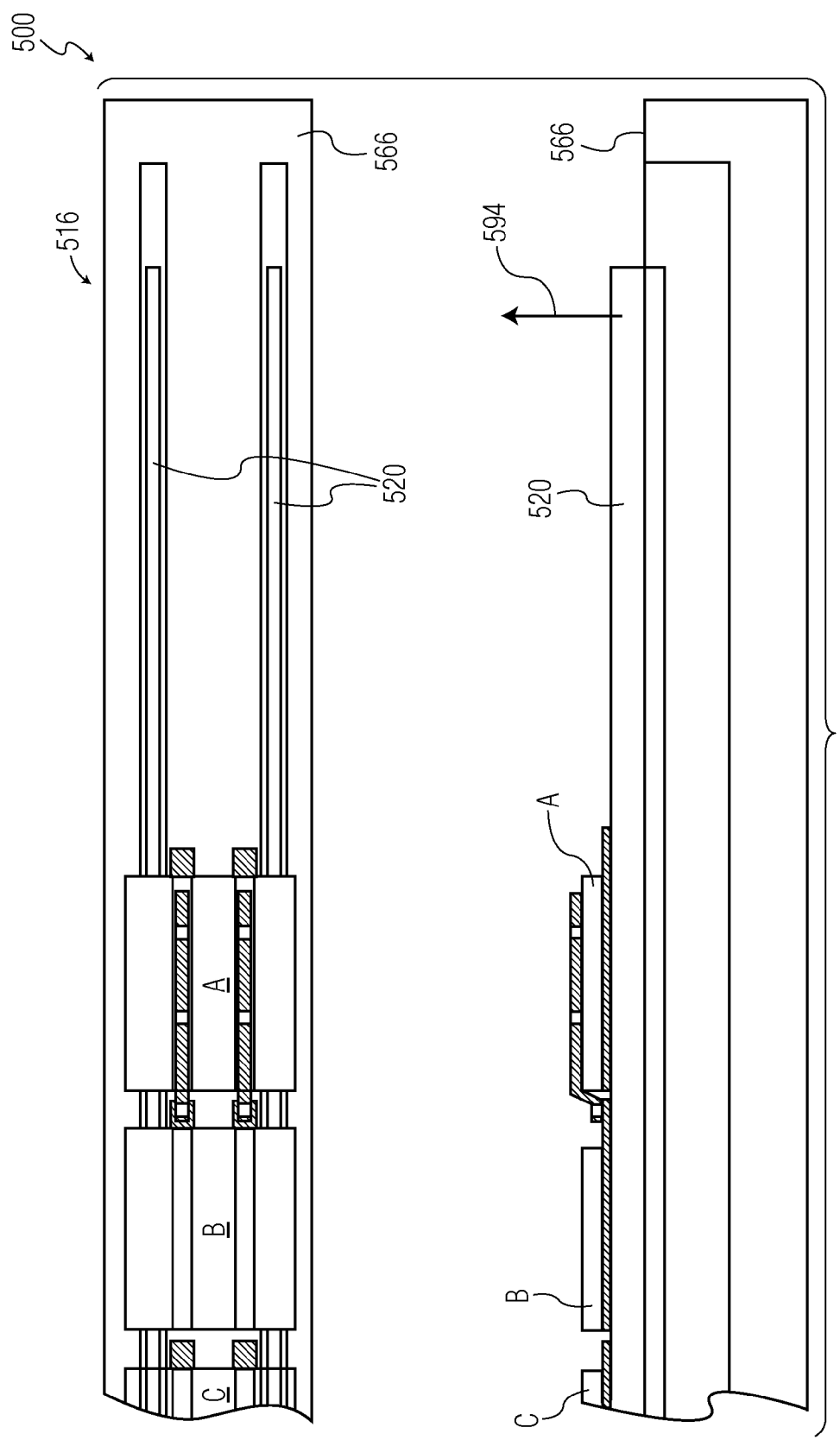
Figure 5C:
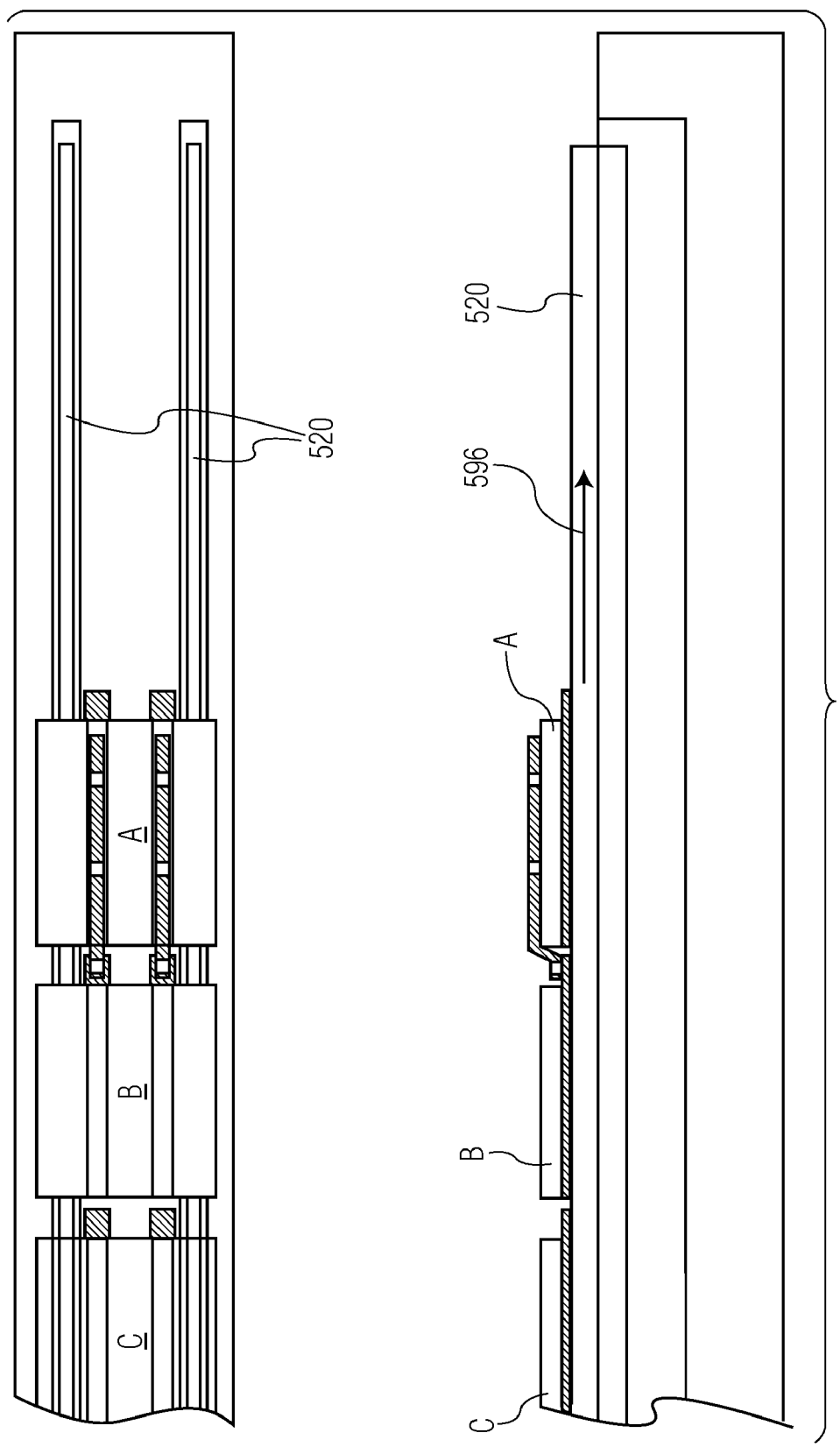
Figure 5D:
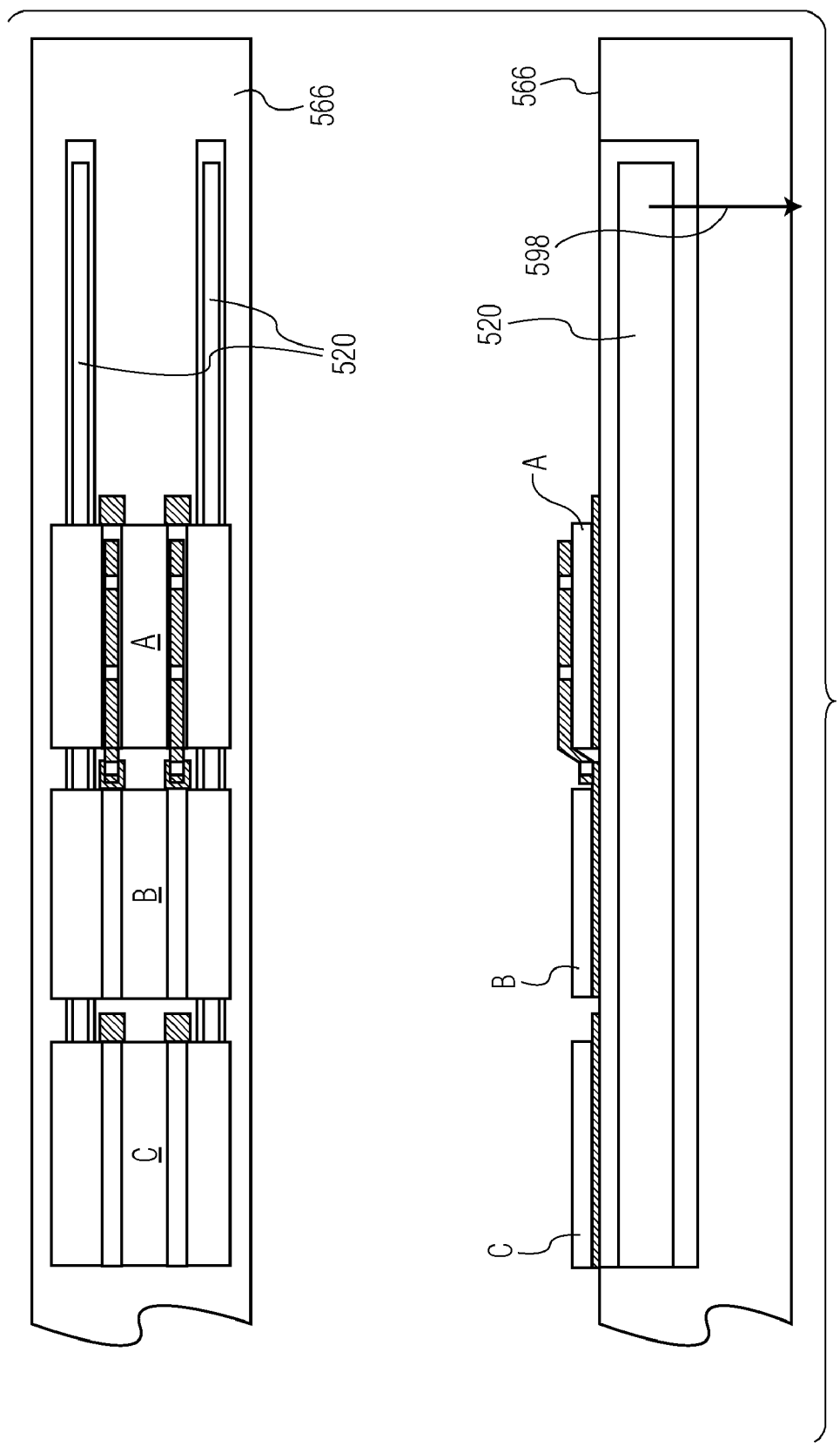

As shown in FIG. 2B, a continuous backside ribbon material has been fed from a backside ribbon supply to a ribbon guide of a continuous ribbon feeding system (e.g., see exemplary ribbon guide 588 and ribbon supply 550 in FIG. 5A), and has been bonded in two separate parallel continuous lengths to solar substrate "A", with respective ribbon material tab segments 136 extending past edge "e" of substrate "A". In this example, the backside ribbon material is bonded at bonded portions 132 to bottom (backside) 138 of solar substrate "A", and cut as shown. A cutter of backside ribbon bonder 104 (e.g., positioned proximate a bonding tool) may be used to cut bonded backside ribbon material segment 134 (continuous with the ultrasonically bonded second ribbon material on the frontside of each of the plurality of solar substrates) at a position along the ribbon proximate the ribbon material segment that extends past edge "e".

Specifically, FIG. 2B illustrates two backside ribbon bonded portions 132 having been formed along each of two lengths of the continuous backside ribbon material (e.g., using the backside ribbon bonding tool (not shown in FIG. 2B)) to form two, substantially parallel bonded backside ribbon segments 134. For example, backside XY table 118 is used to move the backside bonding tool during formation of backside bonded portions 132 (i.e., from first backside bonded portion 132 of the continuous ribbon material to a position to form another backside bonded portion 132 along the same length of ribbon material), and to move the backside bonding tool between the respective backside bonded ribbon material lengths. That is, after completing bonding of the first length of ribbon material to form a first bonded backside ribbon segment 134, the backside bonding tool is moved to a position to form an initial bonded portion 132 of the second length of ribbon material. While two bonded portions 132 have been completed on solar substrate "A", any number of bonded portions 132 may be formed for each length of bonded ribbon material segment 134. Respective tabs/cut portions 136 of bonded backside ribbon segments 134 extend past edge "e" of substrate "A" towards input stack 102. Tabs 136 will provide the area to which frontside bonding ribbons will be bonded as described in detail below.

Figure 2C:
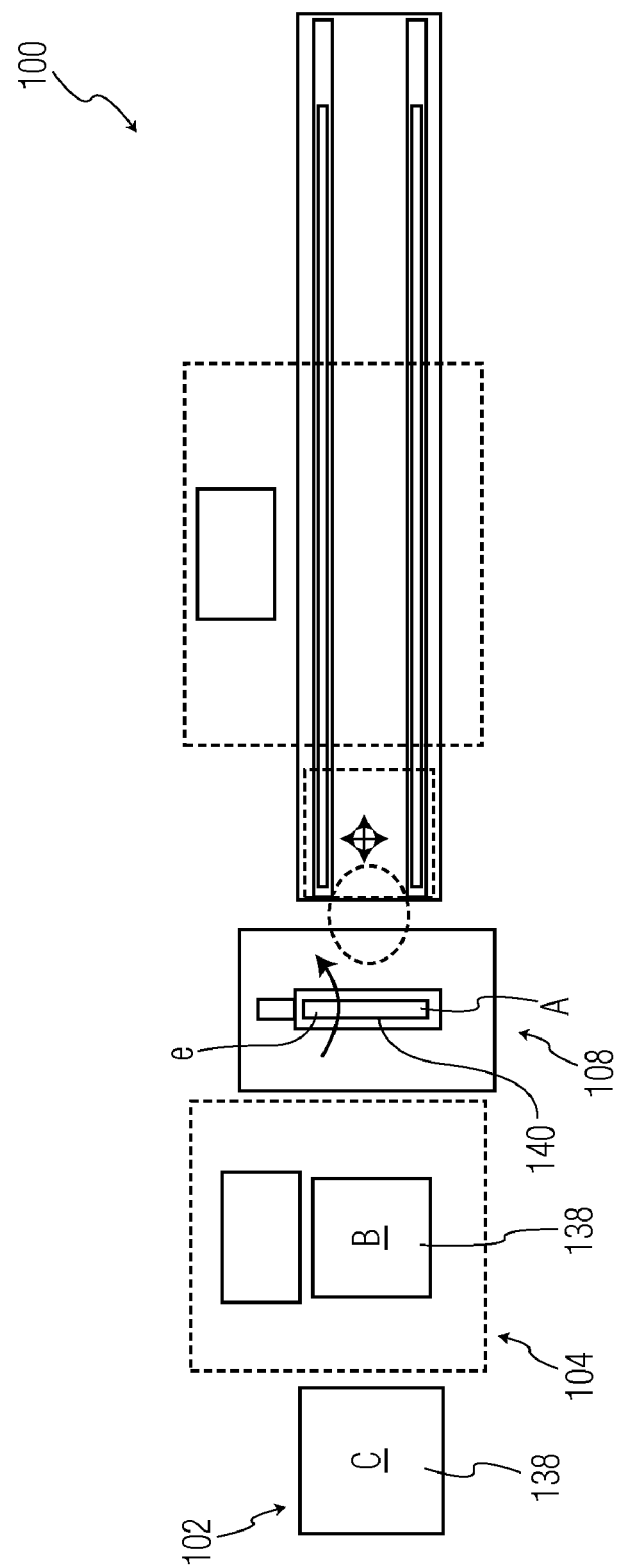

Backside indexing system 124 (e.g., see walking beam elements 120 illustrated in FIG. 1B) is then used to move solar substrate "A" clear of the bond head assembly and towards mechanism 108 so that solar substrate "B" may be positioned in a bonding position on backside ribbon bonder 104 (i.e., the position shown in FIG. 2C with backside 138 of substrate "C" exposed on input stack 102). Substrate "A" is engaged with, and being flipped by, mechanism 108 as shown in FIG. 2C with edge "e" (and thus tabs 136) directed upwards in the view shown.

As noted below, this process of backside indexing and bonding of solar substrates will continue as desired in the specific application. It is noted that multiple backside ribbon bonders may be used to increase the speed of forming the bonded backside ribbon lengths. For example, two ribbon bonders (with separate ribbon supplies) may be provided on opposite sides of the backside indexing system so that one bonder forms bonded portions on the top length of ribbon material and the second bonder forms bonded portions on the bottom length of ribbon material. Such dual bonding may occur simultaneously or nearly simultaneously to increase UPH (units per hour) as desired. The components of the second ribbon bonder may be substantially similar to those illustrated and described with respect to the single ribbon bonder as discussed above. Such dual backside bonders may be positioned in a different configuration (e.g., a side-by-side configuration).

Figure 2D:
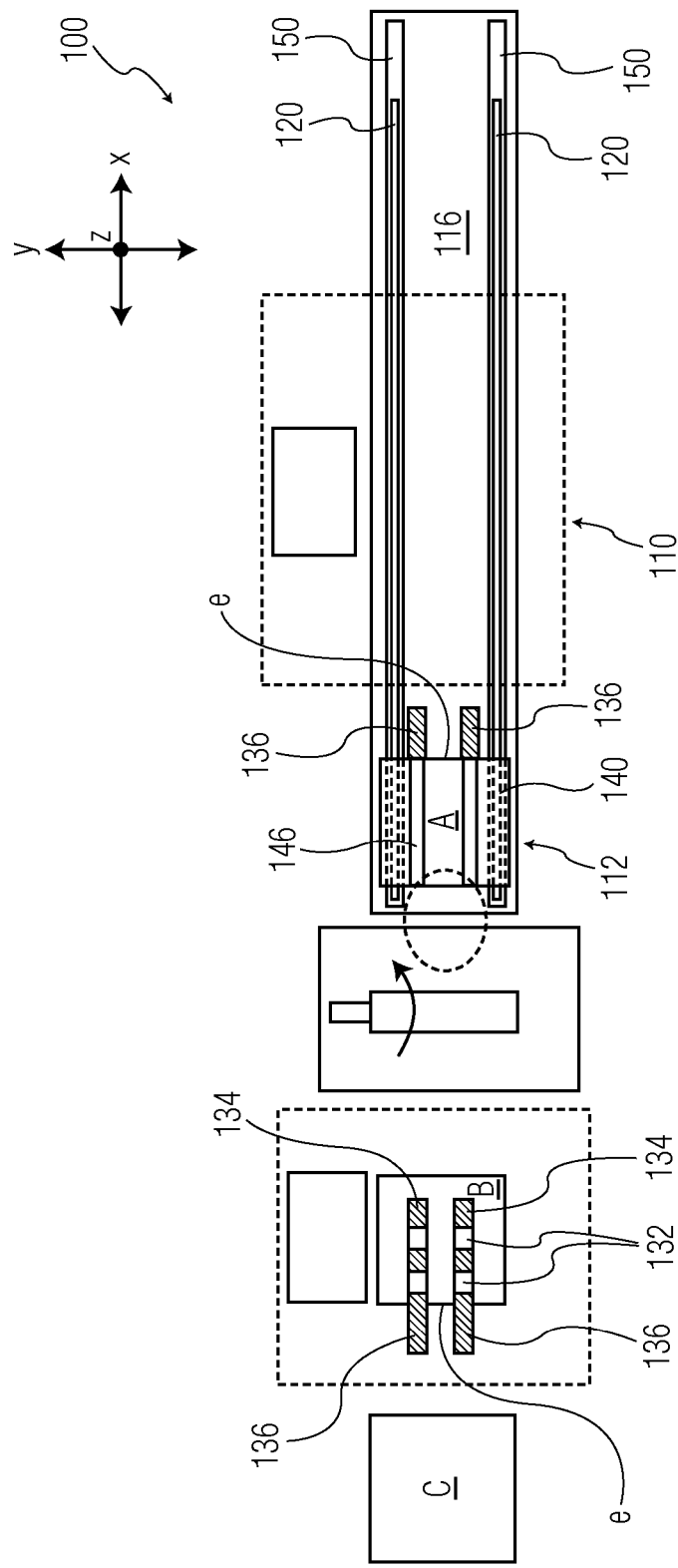

FIG. 2C illustrates the further operation of ultrasonic solar substrate bonding system 100 wherein bonded solar substrate "A" has been moved to mechanism 108 (e.g., flipper 108) configured to manipulate substrate "A" to expose an opposite, frontside 140 of substrate "A" (frontside 140 of substrate "A" is exposed in FIG. 2D). As such, substrate "A" is shown being flipped by mechanism 108 with its edge "e" facing upwards (i.e., out of the page in FIG. 2C), substrate "B" is shown positioned on backside ribbon bonder 104 awaiting bonding with its backside 138 exposed, and substrate "C" is now shown on top of input stack 102 with its backside 138 exposed.

The teachings of the present invention provided herein relative to backside bonding (e.g., including the use of multiple backside ribbon bonders) may also be applied to bonding a frontside ribbon material to a portion (e.g., a conductive busbar or the like) on the frontside of a solar substrate. FIG. 2D illustrates substrate "A" on indexing system 116 with tabs 136 extending past its leading edge "e". Substrate "A" has been aligned by frontside alignment unit 112 in a predetermined position of ultrasonic solar substrate bonding system 100, for example, relative to frontside ribbon bonder 110. In a specific example, substrate "A" may be aligned at a central location of frontside ribbon bonder 110, whereby subsequent substrates ("B", "C", etc.) may be aligned relative to the immediately preceding substrate (e.g., substrate "B" aligned relative to substrate "A", substrate "C" aligned relative to substrate "B", etc.). The relative alignment between adjacent solar substrates (e.g., with predetermined gap 142 between adjacent solar substrates—see FIG. 2G) may be accomplished by aligning a given edge of each substrate (e.g., an edge extending along the X-axis—see legend in FIG. 2D) with the same edge of an adjacent solar substrate.

In FIG. 2D substrate "A" is now supported by indexing system 116 such that parallel busbars 146 are now exposed on frontside 140 of substrate "A" (with parallel frontside walking beam elements 120 within apertures 150). Substrate "B" is shown having been bonded with parallel lengths of bonded backside ribbon material segments 134 at bonded portions 132, and corresponding ribbon material segments/tabs 136 extending past its trailing edge "e" in this example.

Figure 2E:
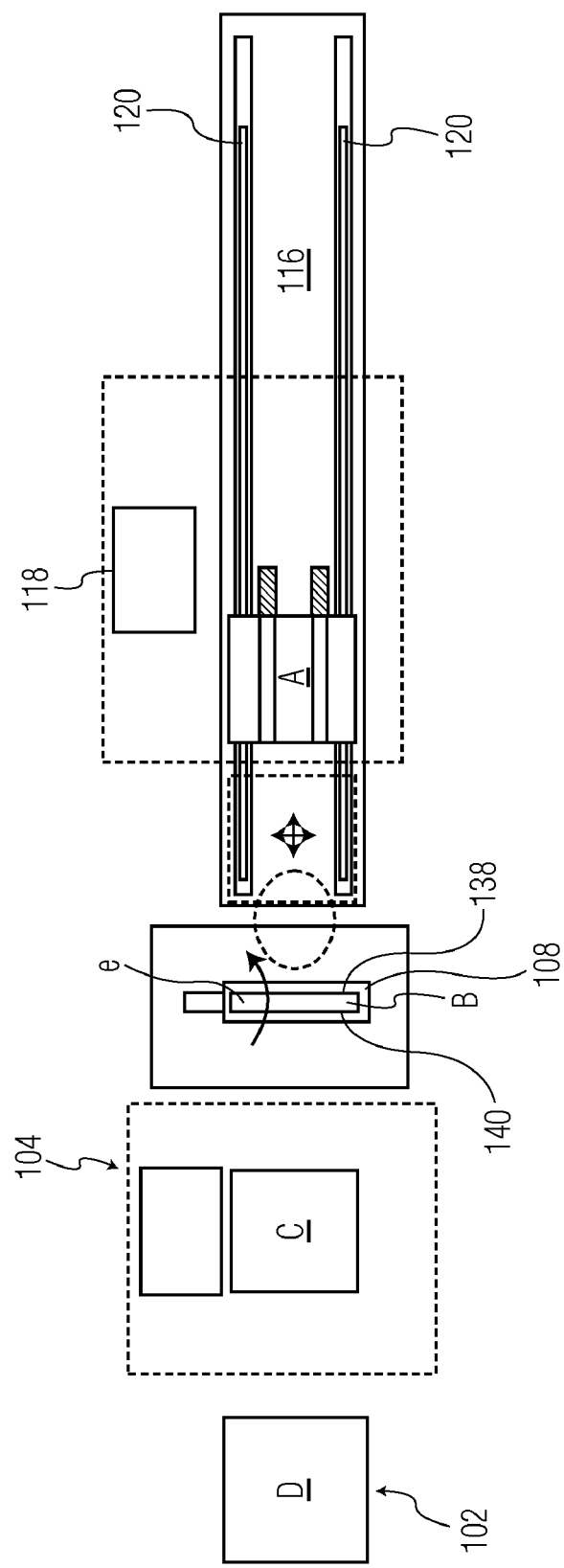

FIG. 2E illustrates the advancement, or movement, of substrate "A" along frontside material handling system 116 towards frontside XY table 118 (which carries a frontside bond head assembly including a bonding tool, not shown but see exemplary bond head assembly BHA in FIG. 5A) by the use of walking beam elements 120 whose operation will be described in detail below (e.g., see FIGS. 5A-5F). Substrate "B" is now in the process of being flipped over (with edge "e" projecting out of FIG. 2E) using mechanism 108 from its backside 138 to expose its frontside 140, substrate "C" is shown positioned on backside ribbon bonder 104 awaiting bonding, and substrate "D" is now shown on top of input stack 102.

Figure 2F:
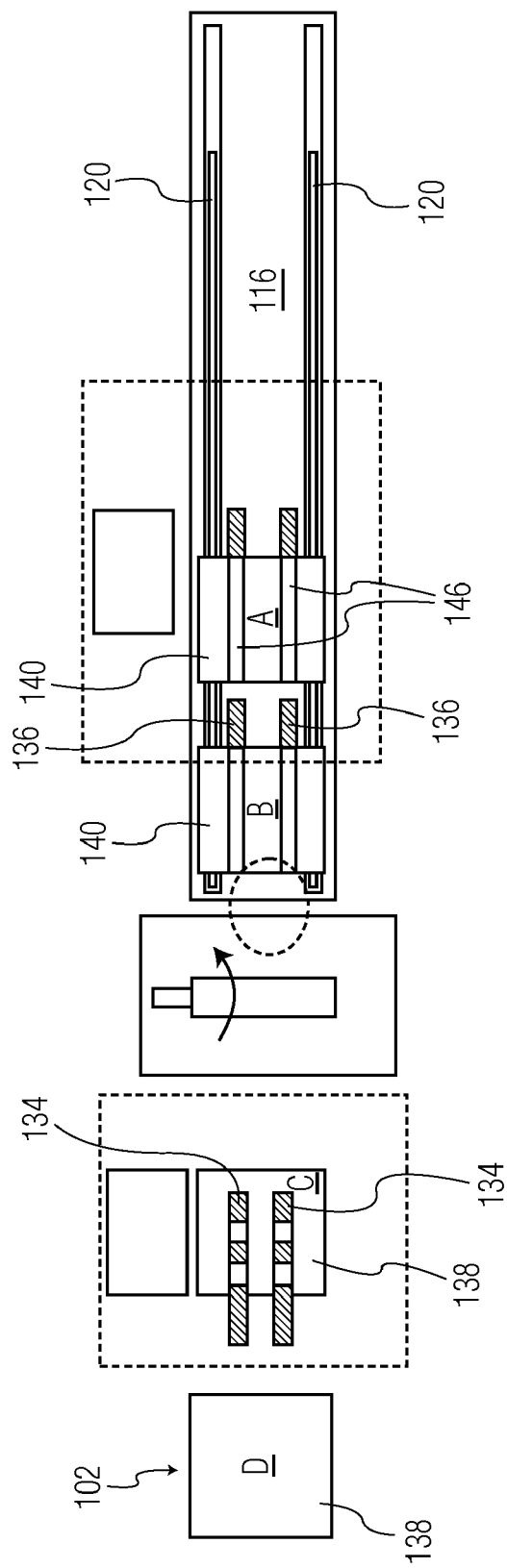

FIG. 2F illustrates the alignment and placement of substrate "B", frontside 140 up, on frontside material handling system 116 and over walking beam elements 120. It is noted that by flipping substrate "B" in the manner illustrated, its backside material ribbon segment tabs 136 point toward substrate "A" such that substrates "A" and "B" are positioned relative to one another to permit bonding of a frontside ribbon material over busbars 146 of substrate "A" and onto a portion of exposed ribbon segment tabs 136 of substrate "B". As before, substrate "C" has parallel lengths of bonded backside ribbon material segments 134 on its backside 138, and backside 138 of substrate "D" is exposed on input stack 102.

FIG. 2G illustrates the advancement of substrates "A" and "B" in unison by the operation of frontside walking beam elements 120 and their position proximate frontside XY table 118. Substrate "C" is now in the process of being flipped over to expose its frontside 140, substrate "D" is shown positioned on backside ribbon bonder 104 awaiting bonding, and substrate "E" is now shown on top of input stack 102.

Figure 2H:
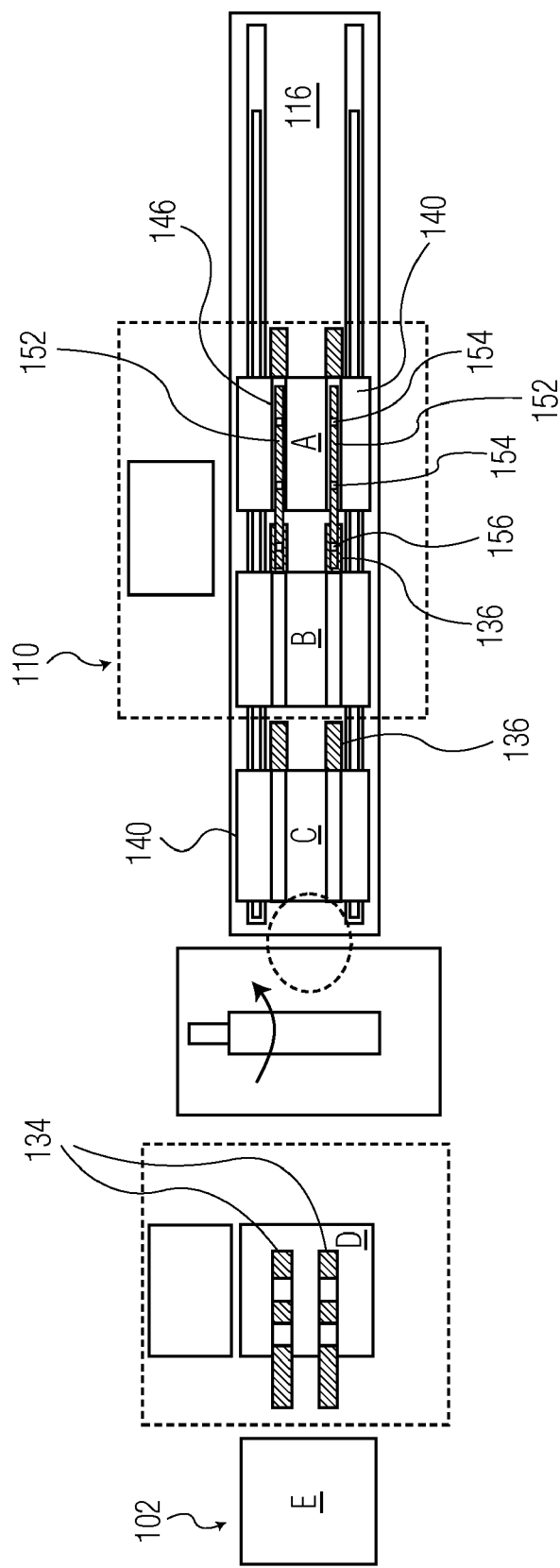
Figure 21:
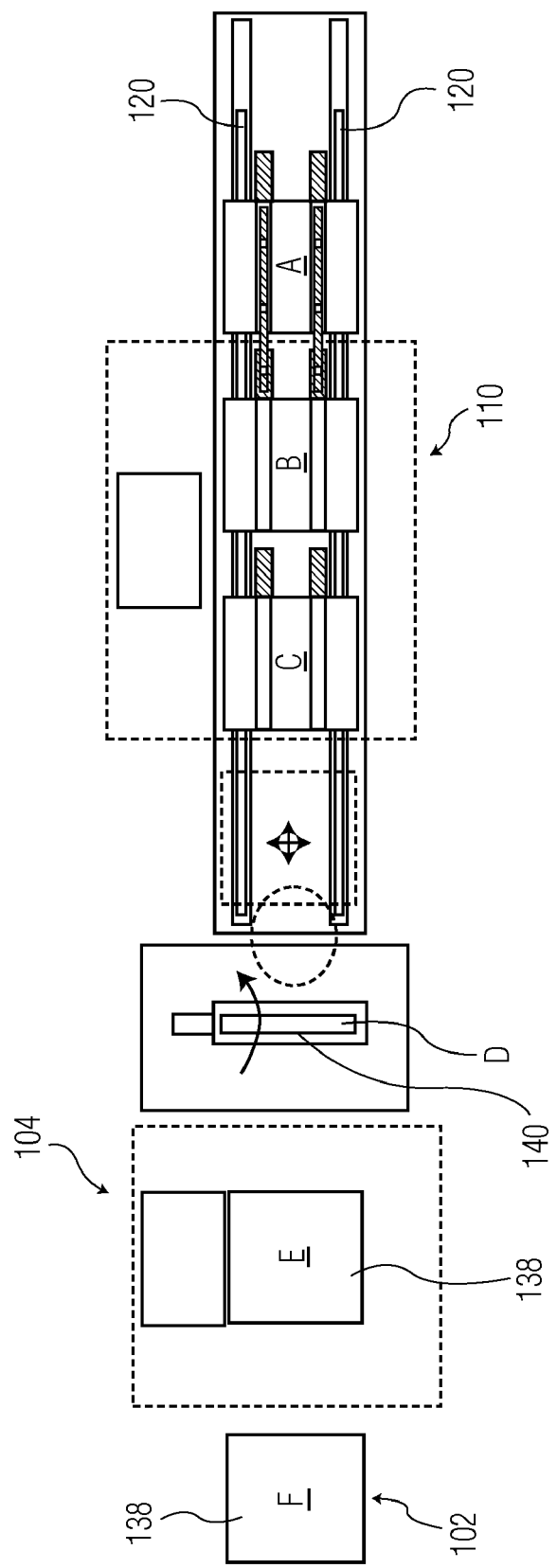

FIG. 2H illustrates bonded frontside ribbon material lengths/portions 152 (formed by frontside ribbon bonder 110) extended between frontside 140 of substrate "A" (e.g., each having 2 bonded portions 154 as shown) to respective backside ribbon material segments/tabs 136 of substrate "B" (e.g., having one bonded portion 156 as shown). That is, the frontside ribbon feeding system (not shown, but see exemplary elements 550, 584 and 588 in FIG. 5A) supplies a continuous length of a frontside ribbon material to the bonding tool during bonding of the continuous ribbon material to: (a) busbars 146 on frontside 140 of substrate "A"; and (b) to a portion of backside ribbon material segment/tab 136 extending from adjacent substrate "B". FIG. 2H also illustrates the alignment and placement of substrate "C" (frontside 140 up) on indexing system 116 of frontside ribbon bonder 110. Also shown is substrate "D" including parallel bonded backside ribbon material segments 134 of backside ribbon material, with substrate "E" exposed on input stack 102.

FIG. 2I illustrates the advancement of substrates "A", "B" (with "A" and "B" bonded together), and "C" in unison by the operation of frontside walking beam elements 120. The advancement ends with substrates "B" and "C" being proximate a bonding position of frontside ribbon bonder 110 (accessible by elements of frontside ribbon bonder 110 including the bonding tool, ribbon feeding system, and ribbon guide not shown but see exemplary elements in FIG. 5A). Substrate "D" is in the process of being flipped over to expose its frontside 140, substrate "E" is shown positioned on backside ribbon bonder 104 awaiting bonding, and substrate "F" is now shown on top of input stack 102, with backsides 138 of substrates "E" and "F" exposed.

Figure 2J:
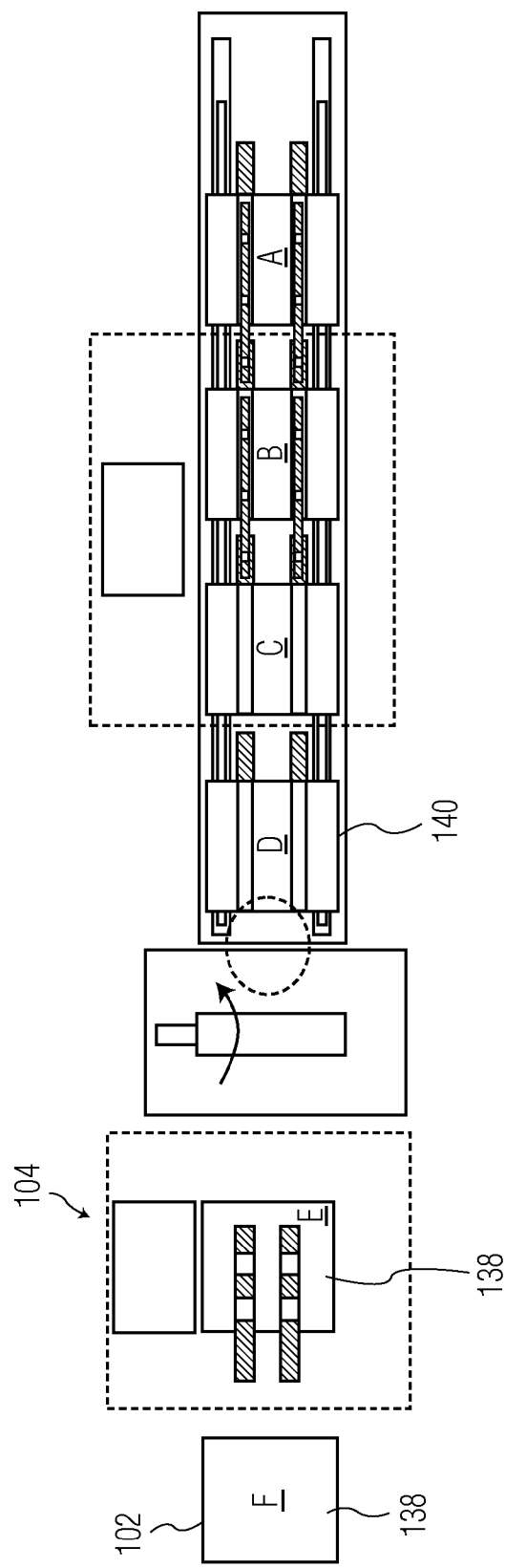
Figure 2K:
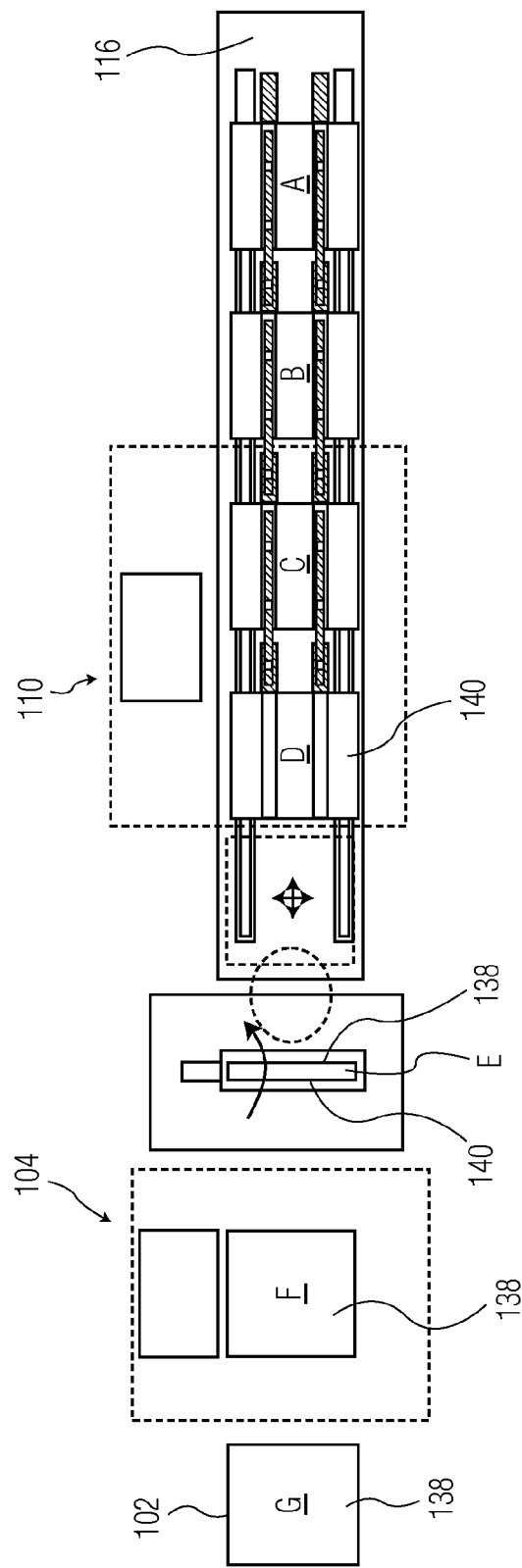

FIG. 2J-2K illustrate: the bonding together of substrates "B" and "C" (in a manner similar to the bonding of substrates "A" and "B" as described above); alignment and indexing of substrate "D" (frontside 140 up); bonding together of substrates "C" and "D"; the backside bonding (and subsequent flipping) of substrate "E"; the positioning of substrate "F" in anticipation of its backside 138 bonding by backside bonder 104; and the uncovering of substrate "G" (backside 138 up, e.g., see FIG. 2K) on top of input stack 102.

Thus, at the point in time shown in FIG. 2K, four substrates "A"-"D" have been bonded together, that is "A" to "B", "B" to "C", and "C" to "D" to form a bonded string of solar substrates "A"-"D" (where a "string" is a plurality of substrates). Further bonding may now take place, for example, substrate "D" to substrate "E", substrate "E" to substrate "F", etc., as desired in a given application. In any event, once the desired number of substrates have been bonded together, frontside indexing system 116 may move the bonded substrates in unison away from frontside ribbon bonder 110 so as to be available for further processing.

Of course, any number of lengths (e.g., one length, three lengths, etc.) of ribbon material (and any number of ribbon bonders, if it is desired to have one bonder for each length of ribbon as discussed above) may be provided as is desired in the given application for the backside and frontside bonding of each solar substrate. Further, while FIGS. 2A-2K illustrate a backside ribbon bonding process followed by a frontside ribbon bonding process, the teachings of the present invention are not limited thereto. For example, it is contemplated that the frontside ribbon bonding process may be performed first, followed by flipping of the substrates and a subsequent backside ribbon bonding process (e.g., where the backside bonded ribbon length may be extended to, and bonded to, a segment of a frontside bonded ribbon material segment).

FIG. 3A illustrates workholder 358 (e.g., integrated into an indexing system of a bonder such as indexing system 116 described above) supporting two adjacent backside bonded solar substrates "A" and "B" positioned adjacent to one another (e.g., such as in the position of solar substrates "A"-"B" in FIG. 2G) in anticipation of the frontside bonding of substrate "A" to substrate "B". While only two backside ribbon bonded portions (132) are shown formed in each length of bonded backside ribbon segments 134 in, for example, FIGS. 2B and 2D, FIG. 3A illustrate the formation of 8 bonded portions 132 in each bonded backside ribbon segment 134 with respective backside ribbon material segments/tabs 136. As noted above, there may be more, or less, than 8 bonded portions 132 in each backside length of ribbon material.

Figure 3B:
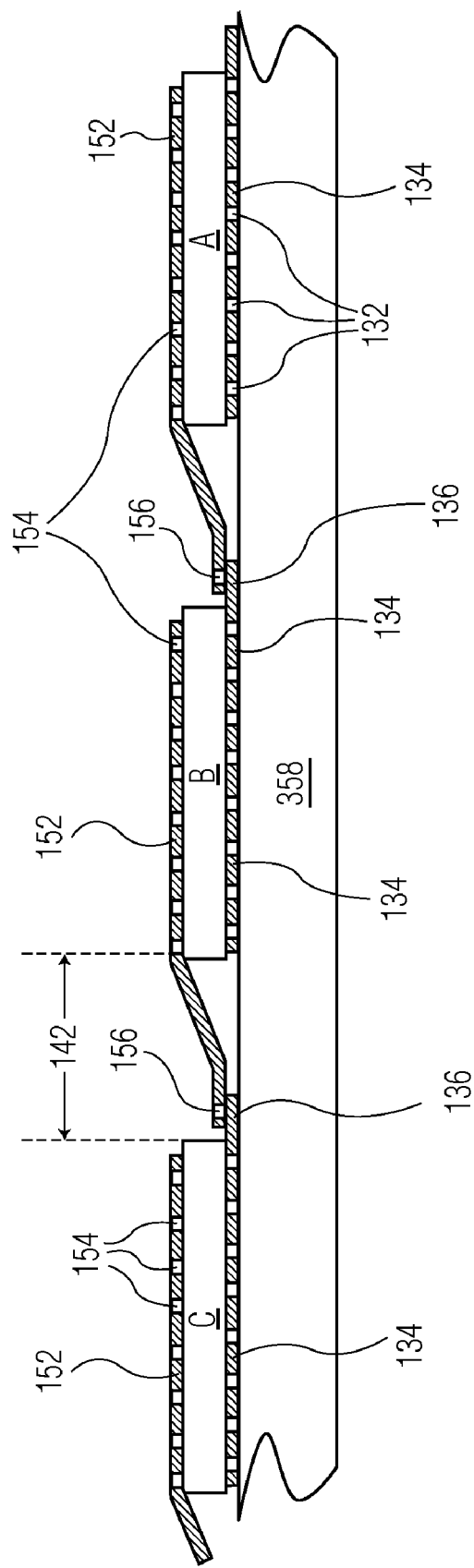
FIGS. 3B-3G are cross-sectional side block diagram views of adjacent backside and frontside bonded solar substrates in accordance with other exemplary embodiment of the present invention.

FIG. 3B illustrates workholder 358 supporting solar substrates "A" and "B", as well as solar substrate "C", with bonded frontside ribbon lengths/segments 152, at frontside ribbon bonded portions 154, with bonded portions 156 connecting substrate "A" to substrate "B', and connecting substrate "B" to substrate "C" at respective tabs 136 (similar to the status of solar substrates "A"-"C" in FIG. 2J). While FIG. 3B illustrates 8 bonded portions 154 formed between the frontside of each solar substrate (e.g., a busbar on the frontside) and the frontside ribbon material lengths, any number of bonded portions 154 may be formed as desired on the given application. Likewise, while the connection between each bonded frontside ribbon segments 152, and corresponding bonded segment 134 of adjacent backside ribbon is illustrated as including only one bonded portion 156, any number of bonded portions 156 may be formed as desired on the given application. FIG. 3B illustrates a "spacing" 142 between adjacent solar substrates. It will be appreciated that the relative length of spacing 142 in FIG. 3B (and in the other drawings, where the spacing is not labeled) is exaggerated for illustration. While an exemplary spacing 142 may be in the range of 1 mm to 4 mm, it is generally desired to have the length of spacing 142 be minimized in a solar application. Further still, while the bonded portions 154 of the frontside ribbon are staggered with respect to the bonded portions 132 of bonded backside ribbon segments 134, other configurations are contemplated (e.g., where the frontside and backside bonded portions 154, 132 oppose one another).

Figure 3C:
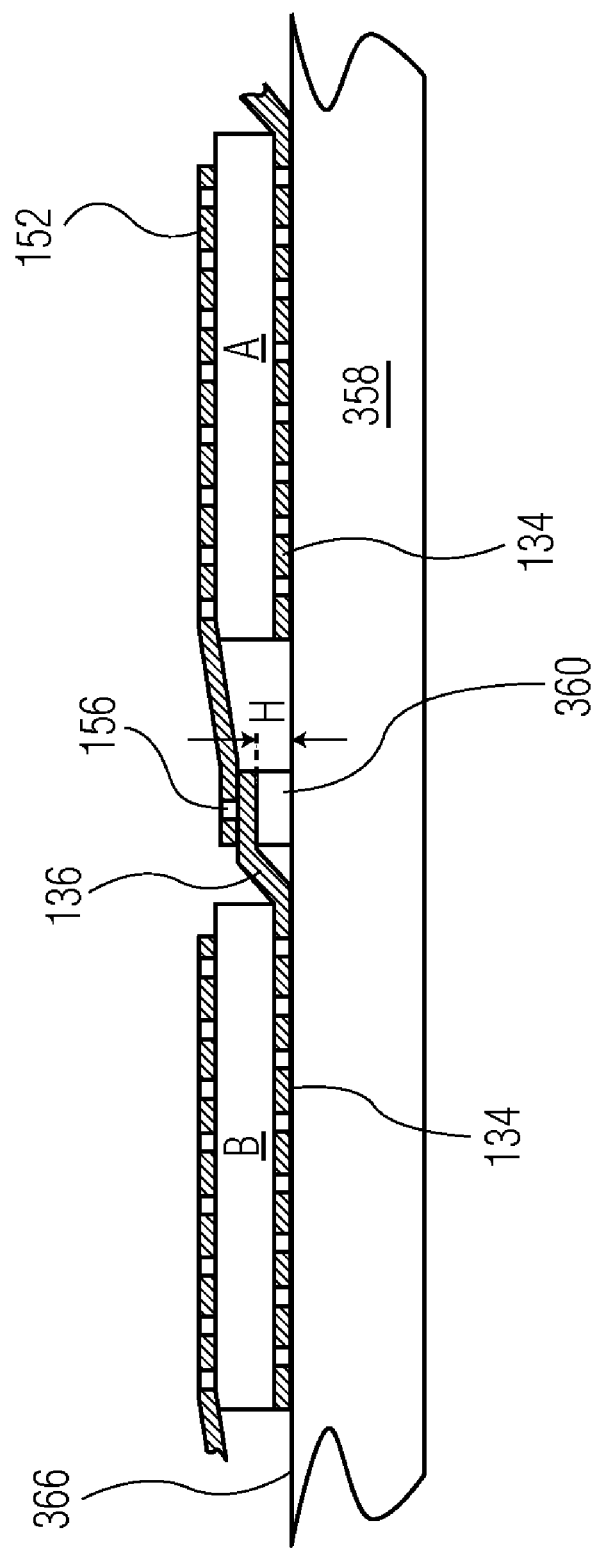
Figure 3D:
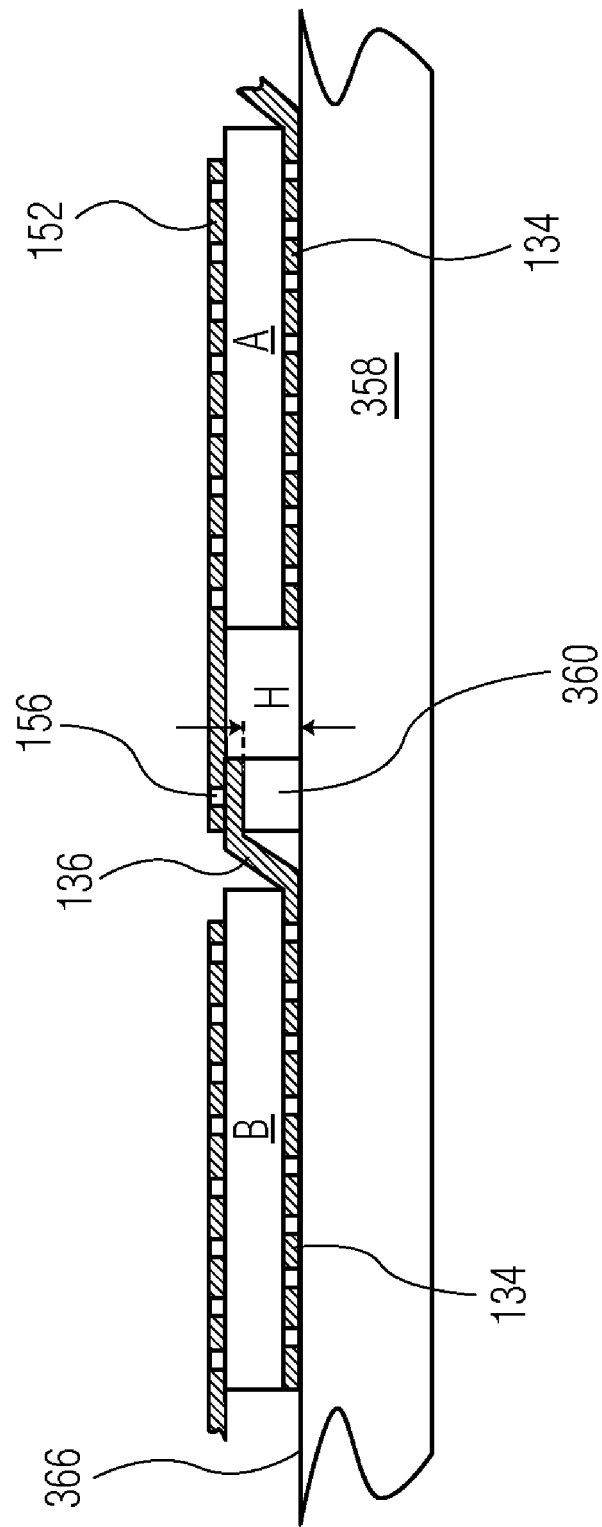
Figure 3E:
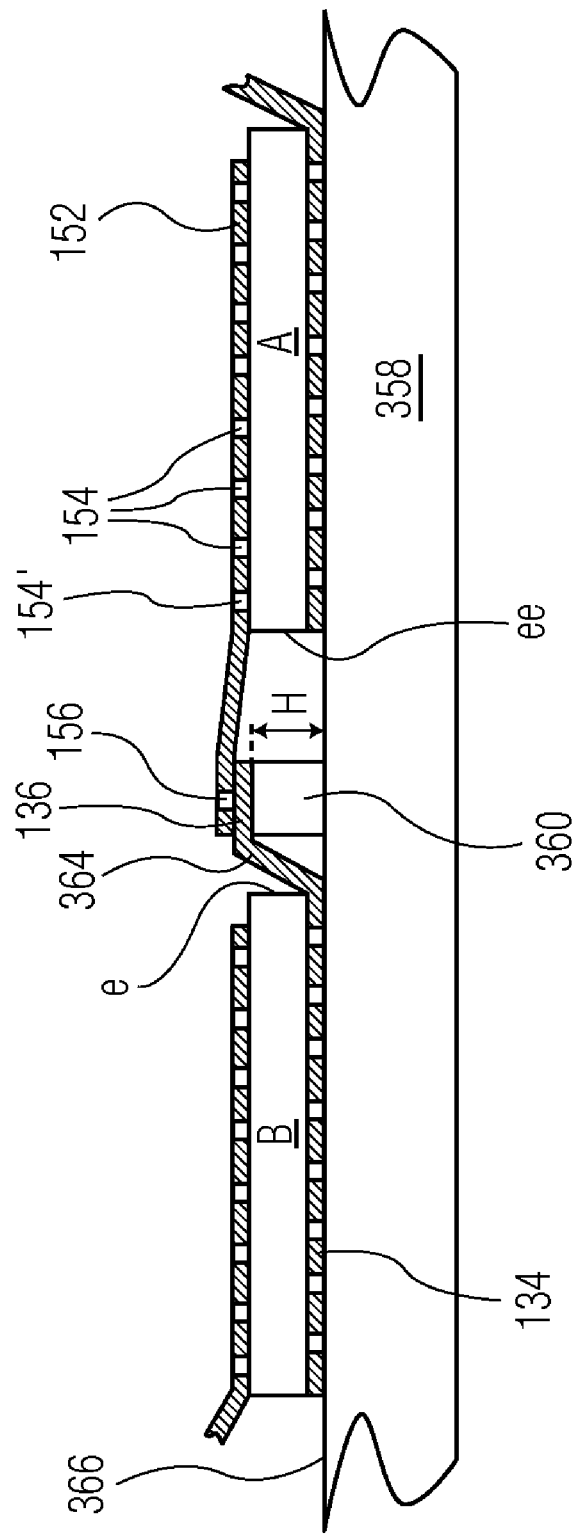

In FIG. 3B, bonded frontside ribbon segments 152 are each bent downward between adjacent cells to join bonded frontside ribbon segments 152 to respective exposed segment/tabs 136 of bonded backside ribbon material segments 134; however, the present invention is not limited thereto. As illustrated in FIGS. 3C-3E, it may be desirable to have exposed backside segment 136 bent upward in varying degrees to limit (e.g., see FIG. 3C), or eliminate (e.g., see FIG. 3D), bending of bonded frontside ribbon segments 152 during bonding to backside tabs 136 (e.g., through the use of workholder inserts 360). This may be particularly desirable in applications where the frontside ribbon material is thicker than the backside ribbon material, and as such, the frontside ribbon material is more susceptible to damage such as cracking (e.g., under service conditions of the module, where the ribbon pieces between the cells will buckle and get stretched due to temperature variations). As illustrated in FIG. 3E, it may also be possible to impart upward bend 362 to bonded frontside ribbon material lengths 152 (which may warrant bonded portion 154' proximate edge "ee" of substrate "A" as illustrated to reduce any potential separation of bonded frontside ribbon material lengths 152 from upper surface/frontside 140 of substrate "A"). Such upward bending 364 of bonded backside ribbon material segments 134 (and upward bending 362 of bonded frontside ribbon material lengths 152 in FIG. 3E) may be accomplished by workholder insert 360 (or other protrusion) positioned between adjacent cells "A" and "B", and above workholder surface 366 during bonding.

The material of insert 360 may be selected to limit the potential for fusing of bonded backside ribbon material segment 134 to insert 360 during bonding. Examples of such materials may include ceramic materials such as zirconia, aluminum oxide (alumina) or zirconia toughened alumina. Thus, the height ("H") of insert 360 above workholder surface 366 (as illustrated in FIGS. 3C-3E) may be selected as desired to impart varying degrees of bending in one or both of bonded backside ribbon material segment 134, and bonded frontside ribbon material length 152 extending beyond respective edges "e", "ee" of adjacent solar substrates "B", "A". The height "H" of insert 360 may be: less than the height of substrate "A" such that bonded frontside ribbon segment 152 has some downward bending, but less than that illustrated in FIG. 3B (e.g., see FIG. 3C); about the height of substrate "A" such that bonded frontside ribbon material length/segment 152 does not need to be bent (e.g., see FIG. 3D); and the height of substrate "A" plus the height of bonded backside ribbon material segment 134, or greater, such that the frontside ribbon has some upward bending (e.g., see FIG. 3E). The height "H" of insert 360 may vary as desired in the given application. For example, the height "H" may be between 0 mm and the thickness of solar substrate "A", and even greater if desired. Three example ranges for the height "H" are: 0 mm-0.25 mm; 0.10 mm-0.20 mm; and 0.08 mm-0.12 mm.

Figure 3F:
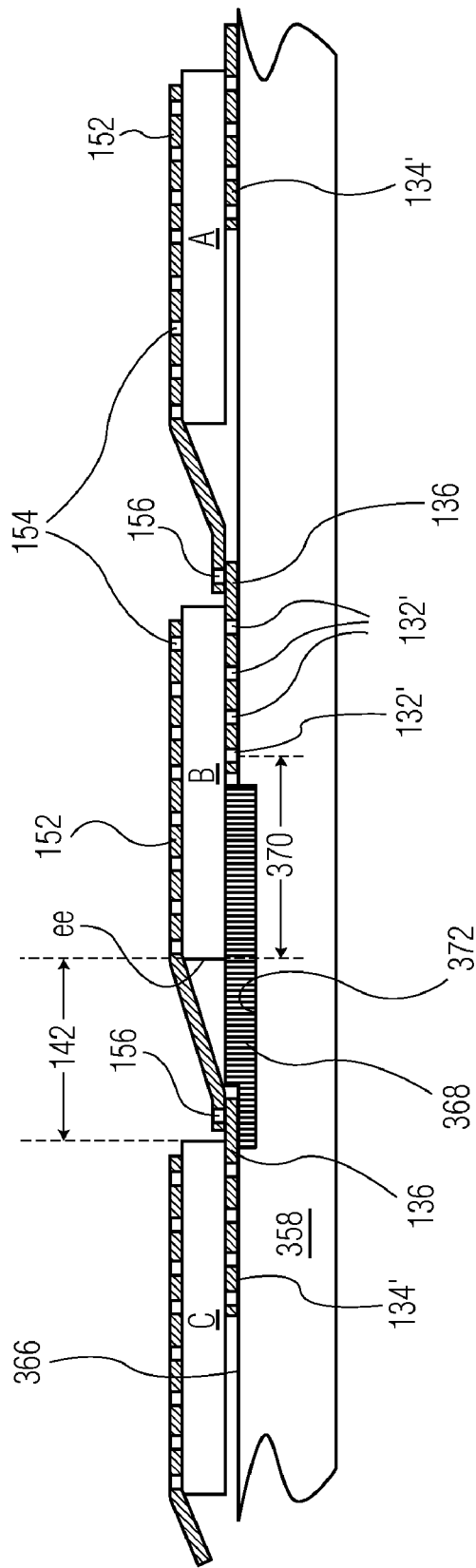
Figure 3G:
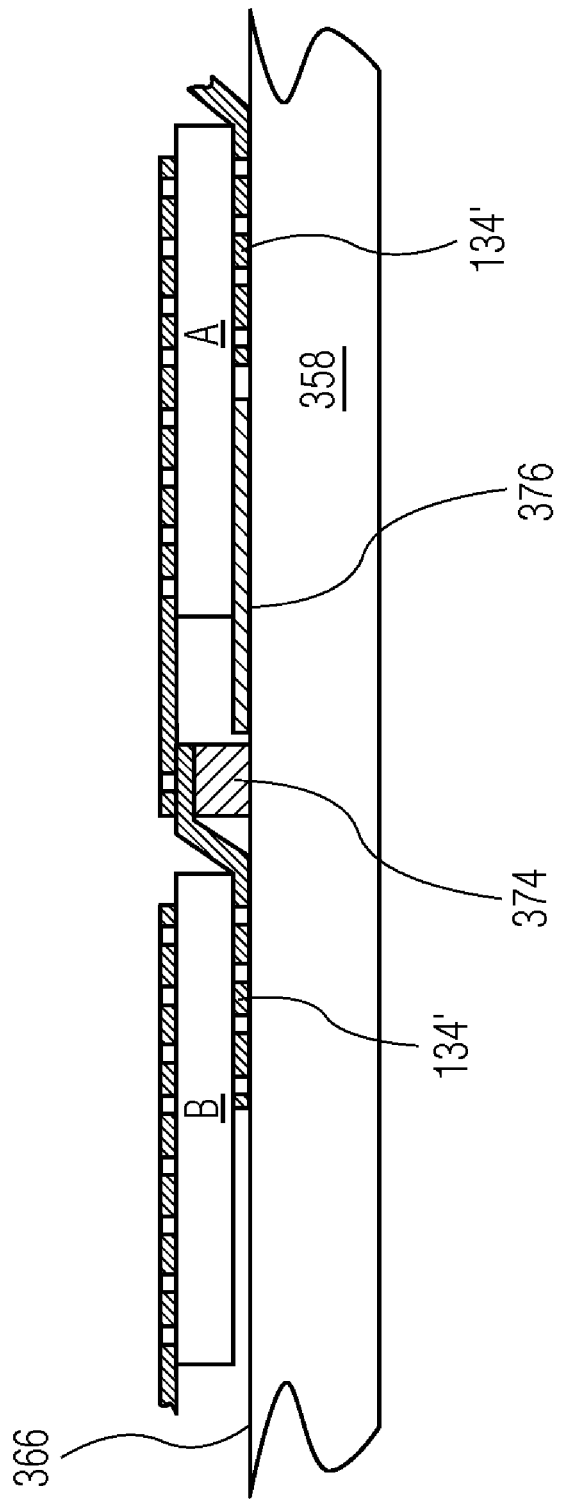

In FIGS. 3A-3E, bonded backside ribbon material segment 134 extends approximately the entire length of backside 138 of the solar substrate to which it is bonded. Of course, this may not be desirable in certain applications. FIGS. 3F-3G illustrate exemplary variations of such applications. Referring specifically to FIG. 3F, one piece insert 368 is provided to: (1) support the bonding of bonded front side ribbon segment 152 from substrate "B" to exposed segment/tab 136 of bonded backside ribbon segment 134' of substrate "C"; and (2) to support the underside of solar substrate "B" in the area where there is no bonded backside ribbon segment 134', thereby reducing the risk of damage during frontside bonding, and during joining of bonded frontside ribbon segment 152 of cell "B" to the bonded backside ribbon segment 134' of cell "C". An exemplary cell spacing/gap 142 of FIG. 3F may be on the order of 2 millimeters. An exemplary distance 370 between last bonded portion 132' of bonded backside ribbon segment 134 of substrate "B", and left edge "ee" of substrate "B" may be on the order of 10 millimeters to 15 millimeters, with a typical distance of 12.5 millimeters. While insert 368 in FIG. 3F is shown as a one piece insert, and is shown as being embedded into recess 372 of workholder 358, it is not limited to having such features. For example, insert 368 may be made of multiple pieces, and the pieces may be mounted to upper surface 366 (or even above upper surface 366) of workholder 358 (e.g., see FIG. 3G). Now referring specifically to FIG. 3G, two separate insert pieces 374, 376 (e.g., workholder insert 374, cell support insert 376) are provided, where the pieces 374, 376 are mounted to upper surface 366 of workholder 358. Any portion of the teachings of FIGS. 3A-3G may be applied to any of the exemplary techniques and systems disclosed herein.

Inserts 360; 368; and 374 may act as anvils and their surface(s) may be structured to provide a range of functionalities. For example, the surface(s) can be structured with small teeth similar to the tip of a bonding tool to provide higher friction to the bonded backside ribbon segment 134 (tab 136). Due to the small dimensions and material type, processing of the insert surface may be done, for example, using laser micromachining. Inserts 360; 368; 374, 376 may also act as a locator for the backside ribbon, as well as a spacer(s) between the bonded backside ribbon segment 134 and an adjacent cell, in order to create a defined minimum gap 142 to eliminate the risk of contact, especially electrical contact with the backside of the adjacent cell (e.g., on the right side).

FIG. 4 is an overhead view, and a corresponding side (and partial cross-sectional) view, of two solar substrates "A"-"B" supported by a workholder during a frontside bonding operation (e.g., of solar substrates "A"-"B" as illustrated in FIG. 2H). That is, at the bonding position of frontside indexing system 416 (and desirably at other locations along frontside indexing system 416), it is desirable to secure string of solar substrates "A"-"B" in place during frontside bonding. Workholder 458 of frontside indexing system 416 may define apertures 450 along its length such that during indexing of a substrate(s)/a string of solar substrates walking beam elements 420 may be raised upwards through apertures 450 and carry substrate(s)/string of solar substrates "A"-"B" as desired. Workholder surfaces 466, and walking beam elements 420 surfaces may, if desired, further define respective vacuum holes 478, 480 such that a negative fluid pressure(s) may be drawn through selected vacuum holes 478, 480 to assist in securing solar substrates "A"-"C" in position during operation of the solar substrate ribbon bonding system. Such vacuum holes 478, 480 may be provided along the entire length of indexing system 416 (e.g., workholder 458 and walking beams 420), or along any portion of indexing system 416, as is desired in the given application.

FIGS. 5A-5F are a series of overhead views, and corresponding side, cross-sectional views, of elements of a frontside ultrasonic ribbon bonder and frontside material handling system. It is noted that the following description may be applied, and modified, for an analogous backside ribbon bonder and backside material handling system (with the backside ribbon bonded portions not shown). At FIG. 5A, first (upper) continuous length of ribbon material 552 has already been bonded across adjacent solar substrates "A", "B", and second (lower) continuous length of ribbon material 552' is still in the process of being bonded across solar substrates "A", "B". That is, in FIG. 5A, bond 556' is being formed (using frontside bonding tool 582) between lower bonded frontside ribbon material 552' of substrate "A" and lower segment/tab 536' of lower bonded backside ribbon material 534' of solar substrate "B". Frontside ribbon material 584 is shown being fed through frontside ribbon guide 588 adjacent frontside bonding tool 582. The detailed view in the larger dashed circle of frontside bonding tool 582, illustrates frontside bond head assembly "BHA", with exemplary frontside pressing member 590, frontside cutter 592, and frontside bonding tool 582. Frontside pressing member 590 is configured to press against the portions of continuous length of ribbon material 584 adjacent ultrasonic bonds (e.g., frontside ribbon bonded portions 554') such that when bonding tool 582 is raised above frontside bonded ribbon material portion 552' (after forming a ribbon bond, e.g., ribbon bond 556') frontside pressing member 590 can secure bonded ribbon material segment 552' and reduce the likelihood and/or risk that frontside ribbon material 584' (that may be stuck to frontside bonding tool 582) is raised upwards with bonding tool 582. Pressing member 590 is moveable independent of movement of bonding tool 582 (and bonding tool 582 may be moveable independent of movement of pressing member 590, if desired) with respect to frontside bond head assembly "BHA" which carries bonding tool 582 and pressing member 590. Further, first ribbon guide 588 is configured to travel along a substantially vertical axis (the "Z" axis shown in the legend) in relation to a first XY table independent of movement of first bond head assembly "BHA", and any second frontside ribbon guide is configured to travel along another substantially vertical axis in relation to a second frontside XY table, independent of movement of a second bond head assembly. Thus, for first and second ribbon bonders, there is a first pressing member proximate the first bonding tool and carried by the first bond head assembly, and a second pressing member proximate the second bonding tool and carried by the second bond head assembly.

Figure 5E:
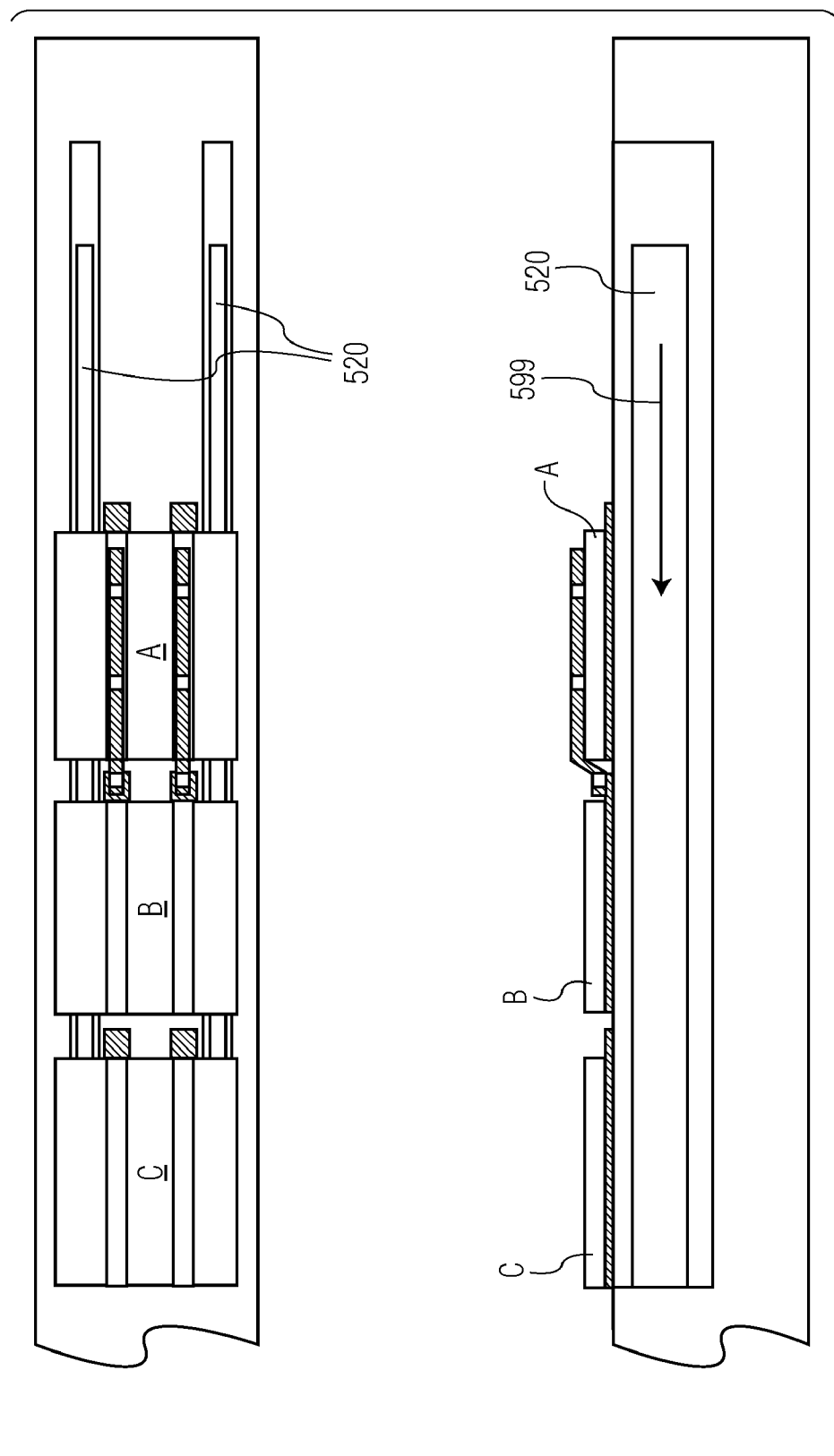
Figure 5F:
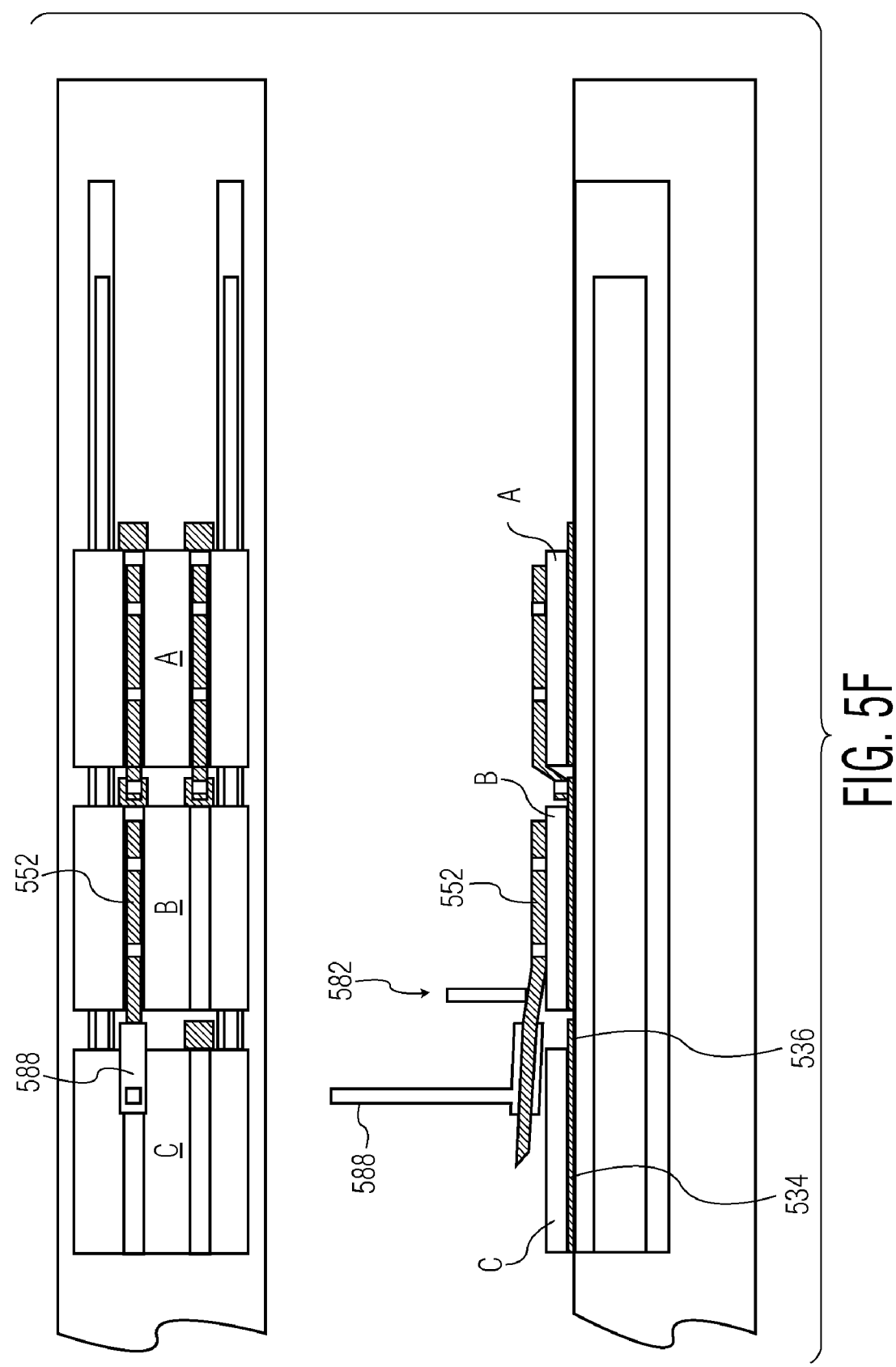

After formation of bond 556' in the lower length of ribbon material at FIG. 5A, it is time to index string of solar substrates "A"-"C" to the right (using frontside indexing system 516) such that solar substrate "C" (partially shown to the left of substrate "B" in FIG. 5A) may be moved to the bonding position (e.g., also see FIG. 2H). Thus, at FIG. 5B, any vacuum through any workholder through holes may be released so that frontside walking beam elements 520 may be raised together, as at arrow 594, to contact and hold (e.g., with walking beam vacuum holes (not shown) that may be defined by walking beam elements 520) string of solar substrates "A"-"C". As will be appreciated by those skilled in the art, in order to index string "A"-"C", the negative pressure drawn through workholder 558 through holes may be shut off (or otherwise released), as frontside walking beam elements 520 rise up and contact string "A"-"C", such that string "A"-"C" may be desirably raised above workholder surface 566 with walking beam elements 520. At FIG. 5C, walking beam elements 520, with string "A"-"C", are moved to the right as at arrow 596. At FIG. 5D, walking beam elements 520, with string "A"-"C", are lowered, as at arrow 598, such that string of solar substrates "A"-"C" may again make contact with workholder surface 566. Solar substrate "C" may now be in the bonding position such that a continuous length of ribbon material may be bonded between solar substrate "B" and solar substrate "C" (e.g., also see FIG. 2I) as was shown in FIG. 5A for substrates "A"-"B". The negative pressure drawn through walking beam elements 520 (if any) may be shut off or otherwise released as string "A"-"C" again contacts upper surface 566 of workholder 558, and the negative pressure may be again drawn through any through holes in workholder surface 566 (e.g., see FIG. 4) to secure "A"-"C" string for bonding. FIG. 5E illustrates walking beam elements 520 moving to the left as at arrow 599, below string of solar substrates "A"-"C", for the next cycle of indexing. FIG. 5F illustrates frontside ribbon guide 588 and bonding tool 582 (with bonding tool 582 not shown in the overhead block diagram view for simplicity) at an intermediate position before formation of a bond between frontside ribbon length 552 (bonded to substrate "B") and tab/segment 536 of bonded backside ribbon material length 534' bonded to substrate "C". Of course, this process repeats as described above until the desired lengths of conductive ribbon material provide interconnection between the desired string of solar substrates, for example, 4 solar substrates "A"-"D" as illustrated in FIG. 2K.

The sizes (widths, thicknesses, materials, etc.) of the ribbons may be selected as desired in the given application. For example, it may be desirable to use relatively narrow (but perhaps thicker) ribbon material on the frontside of the solar substrate as compared to the ribbon material bonded to the backside of the solar substrate. This is because the frontside may include the active (absorbing) solar material and the ribbon material may partially block solar energy from being absorbed. Thus, narrower ribbons may be desired on the frontside; however, if it is desired to have the same current carrying capacity in the frontside and backside ribbons, then the frontside ribbon may be thicker than the backside ribbon to make up for its smaller width (as shown in FIG. 4 where the frontside ribbon is thicker than the backside ribbon). Of course, the current carrying capacity of the frontside and backside ribbons need not be identical. The overall efficiency of a module will generally be higher if electrical losses in the ribbons are reduced. As there may be no constraint to the area of the backside ribbons (except, for example, material cost), they can be made very wide and thin to increase their cross-section but also making them more flexible (and preferably increasing their fatigue lifetime under service conditions).

Although the indexing systems (material handling systems) disclosed herein have primarily been described in connection with walking beam systems, they are not limited thereto. Various types of material handling systems may be used. For example, in connection with the backside ribbon bonder, robotic mechanisms may be used to index each of the solar substrates (e.g., individually, or in a group) as opposed to the walking beam system described herein. Further, any of a number of types of material handling systems (and related elements) may be utilized such as conveyor systems, roller systems, gripping systems, pulling systems, pushing systems, amongst others.

Further, additional material handling system-elements may be provided between the backside ribbon bonder and the frontside ribbon bonder. For example, it may be desirable to include a stack (or other type of buffer) of solar substrates pre-back-side-bonded by a backside ribbon bonder before receipt by the frontside material handling system. Such a pre-bonded buffer of substrates (which may be positioned upstream or downstream of the flipping mechanism) may assist in potential time differences between the backside ribbon bonding operation and the subsequent frontside ribbon bonding operation. It may also be desirable to add quality control equipment between the backside ribbon bonder and the frontside ribbon bonder (e.g., to make sure only backside ribbon bonded cells without any damage are further processed on the frontside ribbon bonder). Examples of such quality control equipment may include vision equipment to check for damaged cells (e.g., cracked cells, cells with missing corners, etc.), or Electro-Luminescence test equipment to visualize micro-cracks that could be caused by the ultrasonic bonding (e.g., due to non-optimal parameters settings, misfunction of the pressing member, etc.).

Further still, the present invention contemplates providing some common equipment (e.g., a common input stack, etc) to feed multiple ribbon bonding lines (e.g., parallel ribbon bonding lines). In such a configuration, each of the parallel ribbon bonding lines could include a backside ribbon bonder and a frontside ribbon bonder, as described above. Further, in such a configuration, additional processing equipment may be provided to process (e.g., align and join) the strings of solar substrates from each of the parallel ribbon bonding lines.

Although the present invention has been described primarily in terms of solar cell bonding applications (e.g., crystalline silicon solar cells, thin film solar cells, etc.), it is not limited thereto. The teachings of the present invention have application in any of a number of ultrasonic bonding applications (e.g., wire bonding to form wire loops or other such interconnecting wires between adjacent solar cells, or in conjunction with semiconductor devices such as wire loops between a die and a semiconductor substrate).

Although the present invention has largely been described with reference to the frontside of the solar substrates including active solar material for absorbing light energy (in contrast to the backside of the solar substrates), it is not limited thereto. That is, the frontside (or backside) of the solar substrate may refer to any side including but not limited to a side including such active solar material or an opposite side which does not include any active solar material. It is understood that either of the frontside, or the backside, may be bonded first as is desired.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ultrasonic solar substrate bonding system comprising:
   a first ribbon bonder including a first bonding tool and a first ribbon feeding system, the first ribbon feeding system being configured to continuously supply a first ribbon material to the first bonding tool during bonding of the first ribbon material to a first side of each of a plurality of solar substrates;
   a mechanism configured to flip each of the plurality of solar substrates after bonding by the first ribbon bonder to expose an opposite, second side of each of the plurality of solar substrates for bonding; and
   a second ribbon bonder including a second bonding tool and a second ribbon feeding system, the second ribbon feeding system being configured to continuously supply a second ribbon material to the second bonding tool during bonding of the second ribbon material to the second side of each of the plurality of solar substrates.

2. The system of claim 1 wherein the first ribbon bonder is configured to bond the first ribbon material to the first side of each of the plurality of solar substrates such that a first ribbon material segment extends past an edge of each of the plurality of solar substrates.

3. The system of claim 2 wherein the second ribbon bonder is configured to bond a portion of the second ribbon material between (1) the second side of a first of the plurality of solar substrates, and (2) the first ribbon material segment of a second of the plurality of solar substrates, the second of the plurality of solar substrates being positioned adjacent the first of the plurality of solar substrates.

4. The system of claim 3 wherein the second ribbon bonder includes a cutter proximate the second bonding tool, the cutter being configured to cut the second ribbon material proximate the first ribbon material segment.

5. The system of claim 1 wherein the first ribbon bonder includes a cutter proximate the first bonding tool, the cutter being configured to cut the first ribbon material proximate a position where a first ribbon material segment extends past an edge of ones of the plurality of solar substrates.

6. The system of claim 1 wherein the second side includes an exposed active solar material configured for receiving light energy and converting the light energy into electrical energy, and the first side is at least partially defined by an electrically conductive region.

7. The system of claim 1 further comprising:
   an input stack configured to hold the plurality of solar substrates before bonding by the first ribbon bonder; and
   a first side alignment unit between the input stack and the first ribbon bonder, the first side alignment unit being configured to align ones of the plurality of solar substrates in a predetermined position of the ultrasonic solar substrate bonding system.

8. The system of claim 7 further comprising a first side material handler system between the input stack and the mechanism configured to manipulate each of the plurality of solar substrates, the first side material handler system being configured to (a) position each of the plurality of solar substrates upstream of the first ribbon bonder, and (b) support the plurality of solar substrates during bonding with the first ribbon material.

9. The system of claim 8 wherein the first side material handler system includes a walking beam structure configured to move ones of the plurality of solar substrates in unison with respect to the first ribbon bonder, and a workholder structure configured to support ones of the plurality of solar substrates during a ribbon bonding operation.

10. The system of claim 9 further comprising a plurality of through holes defined by at least one of the walking beam structure and the workholder structure, wherein a negative fluid pressure is configured to be drawn through the plurality of through holes to retain the plurality of solar substrates in predetermined positions along the backside material handler system.

11. The system of claim 1 further comprising a second side alignment unit between the mechanism and the second ribbon bonder, the second side alignment unit being configured to align ones of the plurality of solar substrates received from the mechanism in a predetermined position of the ultrasonic solar substrate bonding system.

12. The system of claim 11 further comprising a second side material handler system downstream of the mechanism, the second side material handler system being configured to (a) position each of the plurality of solar substrates upstream of the second ribbon bonder, and (b) support the plurality of solar substrates during bonding with the second ribbon material.

13. The system of claim 12 wherein the second side material handler system includes a walking beam structure configured to move ones of the plurality of solar substrates in unison with respect to the second ribbon bonder, and a workholder structure configured to support ones of the plurality of solar substrates during a ribbon bonding operation.

14. The system of claim 13 wherein the walking beam structure moves ones of the plurality of solar substrates on the second side material handler to form a plurality of interconnected solar substrates on the second side material handler downstream of the second ribbon bonder.

15. The system of claim 13 further comprising a plurality of through holes defined by at least one of the walking beam structure and the workholder structure, wherein a negative fluid pressure is configured to be drawn through the plurality of holes to retain the plurality of solar substrates in predetermined positions along the second side material handler system.

16. The system of claim 1 wherein (a) the first ribbon bonder includes a first XY table carrying a first bond head assembly, the first ribbon feeding system including a first ribbon guide carried by the first XY table, the first ribbon guide being configured to guide the first ribbon material from a first ribbon supply to a position proximate the first bonding tool, and (b) the second ribbon bonder includes a second XY table carrying a second bond head assembly, the second ribbon feeding system including a second ribbon guide carried by the second XY table, the second ribbon guide being configured to guide the second ribbon material from a second ribbon supply to a position proximate the second bonding tool.

17. The system of claim 16 wherein the first bond head assembly is configured to travel along a substantially vertical axis independent of movement of the first ribbon guide, and the second bond head assembly is configured to travel along another substantially vertical axis independent of movement of the second ribbon guide.

18. The system of claim 16 further comprising (a) a first cutter carried by the first bond head assembly, the first bond head assembly being configured to rotate in a first XY plane about a first theta ($\theta$) axis such that the first cutter rotates about the first theta ($\theta$) axis with the first bond head assembly, and (b) a second cutter carried by the second bond head assembly, the second bond head assembly being configured to rotate in a second XY plane about a second theta ($\theta$) axis such that the second cutter rotates about the second theta ($\theta$) axis with the second bond head assembly.

19. The system of claim 16 wherein the first ribbon guide is configured to travel along a substantially vertical axis in relation to the first XY table independent of movement of the first bond head assembly, and the second ribbon guide is configured to travel along another substantially vertical axis in relation to the second XY table, independent of movement of the second bond head assembly.

20. The system of claim 16 further comprising:
a first pressing member proximate the first bonding tool and carried by the first bond head assembly, the first pressing member being configured to press against the first ribbon material adjacent ultrasonic bonds formed by the first bonding tool, the first pressing member being moveable with respect to the first bond head assembly independent of movement of the first bonding tool; and
a second pressing member proximate the second bonding tool and carried by the second bond head assembly, the second pressing member being configured to press against the second ribbon material adjacent ultrasonic bonds formed by the second bonding tool, the second pressing member being moveable with respect to the second bond head assembly independent of movement of the second bonding tool.

21. The system of claim 1 wherein the first side of each of the plurality of solar substrates is a backside at least partially defined by an electrically conductive region, and the second side of each of the plurality of solar substrates is a frontside including an exposed active solar material configured for receiving light energy and converting the light energy into electrical energy.

22. The system of claim 1 wherein the first side of each of the plurality of solar substrates is a frontside including an exposed active solar material configured for receiving light energy and converting the light energy into electrical energy, and the second side of each of the plurality of solar substrates is a backside at least partially defined by an electrically conductive region.

* * * * *